(12) United States Patent
Shin et al.

(10) Patent No.: US 10,679,957 B2
(45) Date of Patent: Jun. 9, 2020

(54) SEMICONDUCTOR DEVICE

(71) Applicant: SAMSUNG ELECTRONICS CO., LTD., Suwon-si, Gyeonggi-Do (KR)

(72) Inventors: Seok-Ho Shin, Seoul (KR); Bonhwi Gu, Seoul (KR); Hyekyeong Kweon, Seoul (KR); Sungjin Kim, Seoul (KR); Joodong Kim, Hwaseong-si (KR); Jaepil Lee, Seoul (KR); Dongwon Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/140,252

(22) Filed: Sep. 24, 2018

(65) Prior Publication Data

US 2019/0221535 A1    Jul. 18, 2019

(30) Foreign Application Priority Data

Jan. 18, 2018 (KR) ........................ 10-2018-0006538

(51) Int. Cl.
*H01L 23/48* (2006.01)
*H01L 23/00* (2006.01)
(Continued)

(52) U.S. Cl.
CPC .............. *H01L 24/09* (2013.01); *H01L 22/32* (2013.01); *H01L 22/34* (2013.01); *H01L 23/5226* (2013.01); *H01L 23/535* (2013.01); *H01L 23/53295* (2013.01); *H01L 24/05* (2013.01); *H01L 24/06* (2013.01); *H01L 2224/02166* (2013.01); *H01L 2224/02375* (2013.01); *H01L 2224/05* (2013.01); *H01L 2224/05569* (2013.01); *H01L 2224/06135* (2013.01); *H01L 2924/00014* (2013.01); *H01L 2924/14* (2013.01)

(58) Field of Classification Search
CPC ... H01L 23/32; H01L 23/5226; H01L 23/535; H01L 2224/02375
See application file for complete search history.

(56) References Cited

U.S. PATENT DOCUMENTS 8,432,868 B2    5/2013  Shigihara et al.
8,791,574 B2    7/2014  Akiba et al.
(Continued)

FOREIGN PATENT DOCUMENTS

JP    201114605 A    1/2011
KR    100690512 B1    2/2007
KR    1020170040842 A    4/2017

*Primary Examiner* — Phuc T Dang
(74) *Attorney, Agent, or Firm* — Volentine, Whitt & Francos, PLLC

(57) ABSTRACT

A semiconductor device includes a semiconductor substrate having a chip region and an edge region, a plurality of connection structures provided in a lower insulating layer of the edge region and arranged at first intervals in a first direction, an upper insulating layer covering the connection structures, and a plurality of redistribution pads disposed on the upper insulating layer and connected to the connection structures, respectively. Each of the redistribution pads includes a pad portion provided on the chip region. The pad portions of the redistribution pads are spaced apart from the connection structures by a first distance in a second direction intersecting the first direction when viewed in a plan view.

18 Claims, 21 Drawing Sheets

(51) Int. Cl.
*H01L 21/66* (2006.01)
*H01L 23/522* (2006.01)
*H01L 23/535* (2006.01)
*H01L 23/532* (2006.01)

(56) References Cited

U.S. PATENT DOCUMENTS

| | | |
|---|---|---|
| 9,541,601 B2 | 1/2017 | Pagani |
| 2001/0042901 A1 | 11/2001 | Maruyama |
| 2013/0153888 A1* | 6/2013 | Inoue ................ H01L 29/66477 |
| | | 257/43 |
| 2013/0299947 A1 | 11/2013 | Uehling |
| 2014/0151838 A1* | 6/2014 | Iizuka ............... H01L 27/14636 |
| | | 257/433 |
| 2015/0021733 A1 | 1/2015 | Nakamura et al. |
| 2015/0079762 A1 | 3/2015 | Nakagawa et al. |
| 2016/0218136 A1* | 7/2016 | Lee ................... H01L 27/14636 |
| 2017/0098619 A1 | 4/2017 | Han et al. |
| 2018/0261467 A1* | 9/2018 | Matsumoto ......... H01L 21/3205 |
| 2019/0148340 A1* | 5/2019 | Yu .......................... H01L 21/56 |
| | | 257/737 |

* cited by examiner

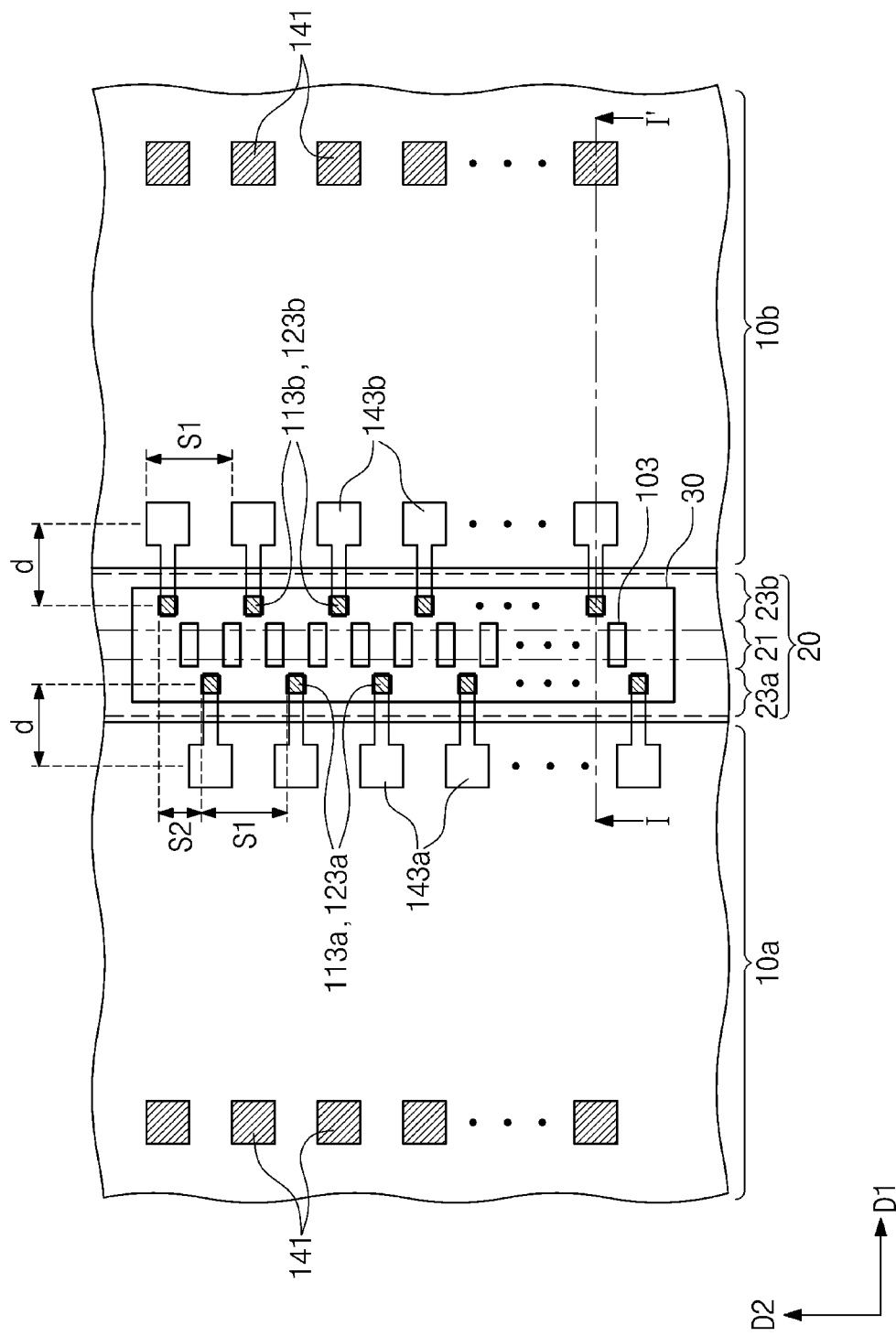

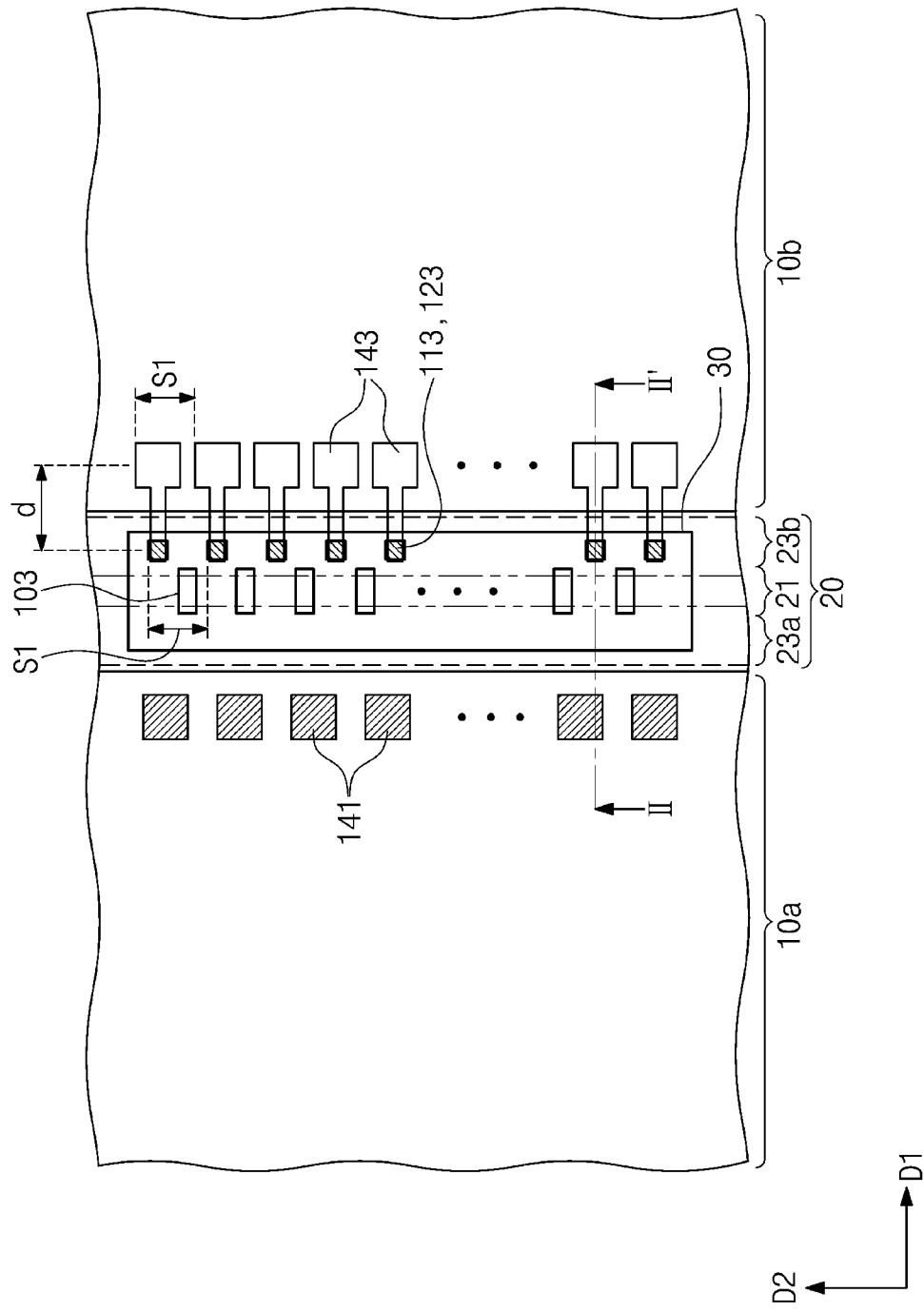

US 10,679,957 B2

SEMICONDUCTOR DEVICE

PRIORITY STATEMENT

This U.S. non-provisional patent application claims priority under 35 U.S.C. § 119 to Korean Patent Application No. 10-2018-0006538, filed on Jan. 18, 2018, in the Korean Intellectual Property Office, the disclosure of which is hereby incorporated by reference in its entirety.

BACKGROUND

The inventive concepts relates to a semiconductor device and, more particularly, to a semiconductor device including a redistribution pad.

A semiconductor package may include a semiconductor device capable of storing a lot of data and of processing the stored data in a short time. The semiconductor device may include an internal integrated circuit used to store and/or process data, and chip pads used to input data from an external system to the internal integrated circuit and/or to output data from the internal integrated circuit to the external system. In addition, the semiconductor device may include redistribution layers forming internal interconnection structures which are connected to the chip pads and to redistribution pads disposed at predetermined positions at the top of the semiconductor device.

SUMMARY

According to an aspect of the inventive concept, a semiconductor device includes a semiconductor substrate having a chip region and an edge region around the chip region, a lower insulation layer covering the edge region, a plurality of connection structures in the lower insulating layer and disposed over the edge region with the connection structures spaced from each other by first intervals in a first direction, an upper insulating layer covering the connection structures, and a plurality of redistribution pads disposed on the upper insulating layer, each of the redistribution pads being electrically connected to the connection structures, respectively. The redistribution pads include pad portions, respectively. The pad portions are located over the chip region. Furthermore, the pad portions of the redistribution pads are collectively spaced apart from the connection structures in a second direction intersecting the first direction when viewed in a plan view.

According to another aspect of the inventive concept, a semiconductor device includes a semiconductor substrate having a chip region including a first pad region and a second pad region spaced apart from each other and an edge region around the chip region, a plurality of chip pads located over the first pad region with the chip pads being spaced apart from each other, a plurality of redistribution pads located over the second pad region with the redistribution pads being spaced apart from each other in a first direction, and a plurality of connection structures connected to the plurality of redistribution pads. The connection structures are located over the edge region and are spaced apart from the redistribution pads in a second direction intersecting the first direction.

According to still another aspect of the inventive concept, a semiconductor device includes a semiconductor substrate having a chip region and an edge region around the chip region, a lower insulating layer disposed on the semiconductor substrate, a plurality of connection structures in the lower insulating layer as located over the edge region of the semiconductor substrate and spaced from each other by first intervals in a first direction, an upper insulating layer disposed on the lower insulating layer and covering the connection structures, and redistribution pads disposed on the upper insulating layer and electrically connected to the connection structures, respectively. Each of the redistribution pads includes a via portion, a pa portion and a line-shaped portion. The via portion extends vertically in the upper insulating layer, located over the edge region and by which the redistribution pad is electrically connected to one of the connection structures. The pad portion is disposed on the upper insulating layer and located over the chip region. And the line-shaped portion extends in a second direction intersecting the first direction on a top surface of the upper insulating layer and electrically connecting the via portion to the pad portion.

According to yet another aspect of the inventive concept, a semiconductor device as an article of manufacture to be singulated into chips includes a semiconductor substrate having an array of chip regions and a scribe lane region in between the chip regions and which scribe lane region includes a cutting region and an edge region directly adjacent to the chip regions so as to be located between the cutting region and the chip regions, integrated circuits in the chip regions of the semiconductor substrate, respectively, test circuits, configured to test the integrated circuits, in the scribe lane region of the semiconductor substrate, lower device insulation extending over the chip regions and edge region of the semiconductor substrate, upper device insulation extending over the lower device insulation, connection structures extending through the lower device insulation and electrically connected to the test circuits, and a plurality of redistribution pads electrically connected to the connection structures so as to be electrically connected to the test circuits via the connection structures. The plurality of redistribution pads includes a respective array of conductive pads located over each of a plurality of the chip regions of the semiconductor substrate as disposed on the upper device insulation, whereby the test circuits can be accessed using the conductive pads. Furthermore, each of the redistribution pads extends from a respective one of the chip regions to at least the edge region of the scribe lane region as viewed in a plan view.

BRIEF DESCRIPTION OF THE DRAWINGS

The inventive concepts will become more apparent in view of the attached drawings and accompanying detailed description.

FIG. 5 is an enlarged plan view of a portion of a semiconductor device according to some examples of the inventive concepts.

FIG. 7 is an enlarged plan view of a portion of a semiconductor device according to some examples of the inventive concepts.

DETAILED DESCRIPTION

Hereinafter, examples of the inventive concepts will be described with reference to the accompanying drawings.

Figure 1:
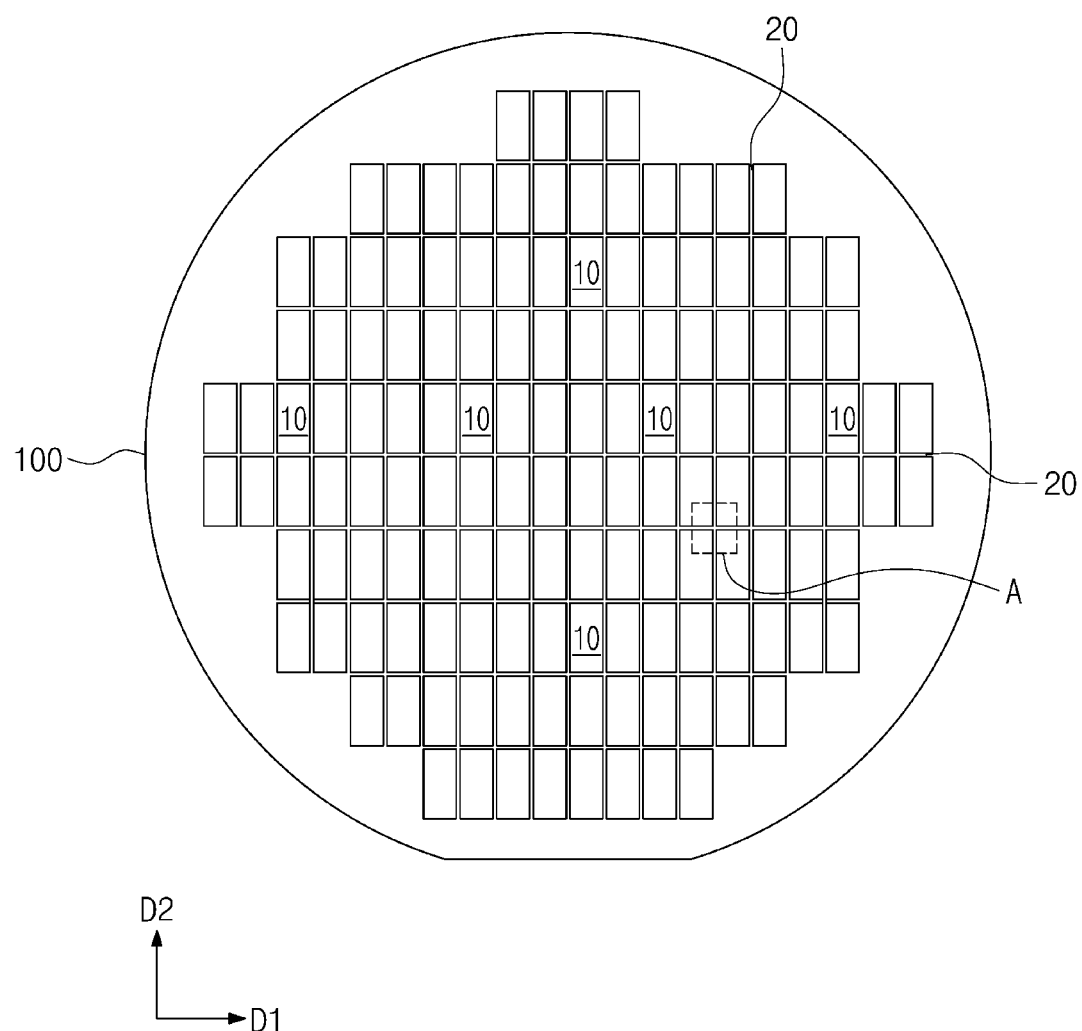
FIG. 1 is a plan view of a semiconductor device structure including a substrate in which semiconductor devices are integrated according to some examples of the inventive concepts.
Figure 2:
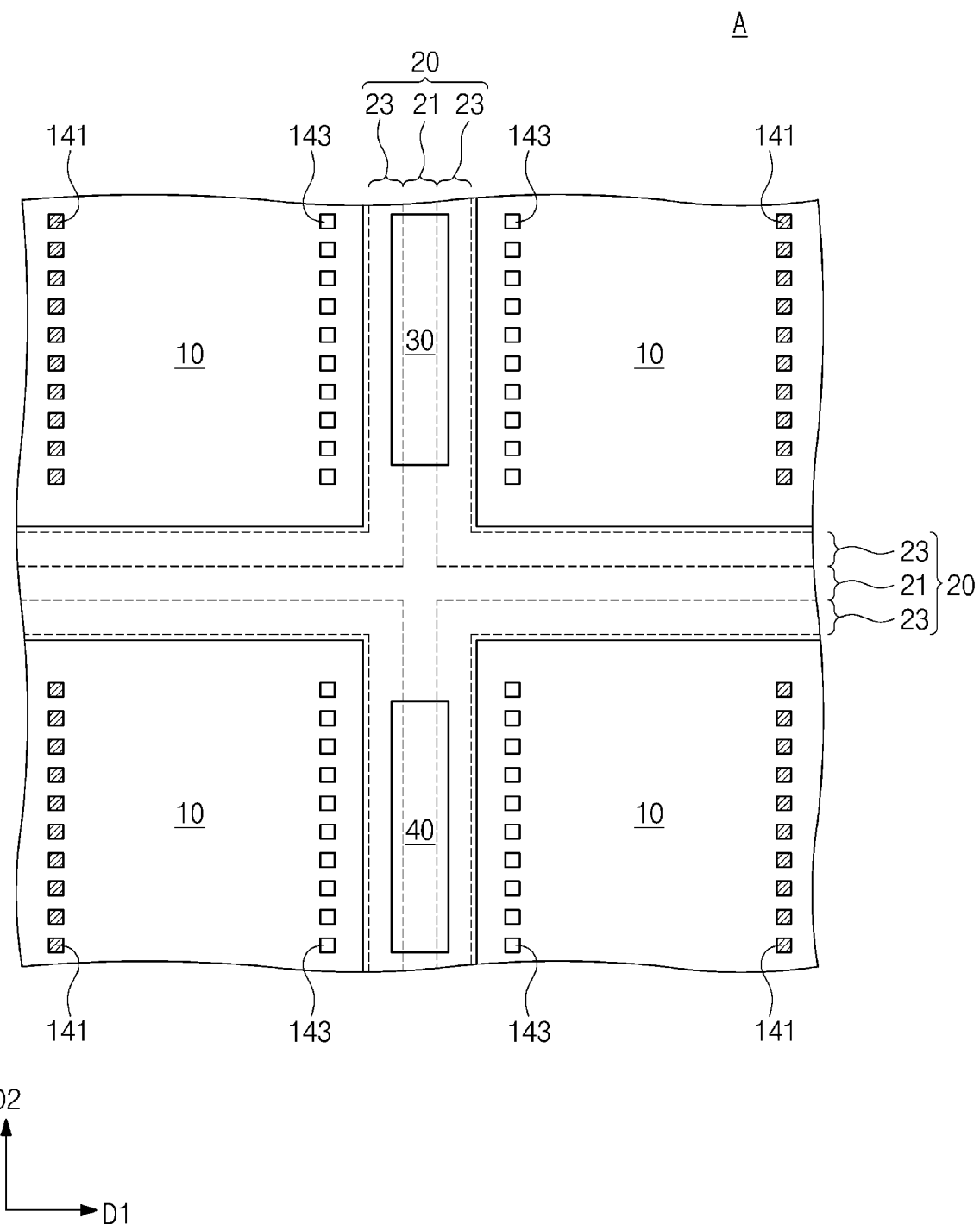
FIG. 2 is an enlarged view of a portion 'A' of FIG. 1.

FIG. 1 is a plan view of a semiconductor substrate on which semiconductor devices according to some examples of the inventive concepts are integrated. FIG. 2 is an enlarged view of a portion 'A' of FIG. 1.

Referring to FIGS. 1 and 2, a semiconductor substrate 100 may include chip regions 10 and a scribe line region 20 between the chip regions 10. Semiconductor integrated circuits may be formed on the chip regions 10, respectively.

The chip regions 10 may be arranged along a direction D1 and a direction D2 perpendicular to the direction D1 on a front surface of the semiconductor substrate 100. Each of the chip regions 10 may be surrounded by the scribe line region 20.

The scribe line region 20 may include a cutting region 21 to be cut by a sawing or cutting machine and edge regions 23 disposed between the cutting region 21 and the chip regions 10.

The semiconductor substrate 100 may include a material having a semiconductor characteristic (e.g., a silicon wafer) or may include a semiconductor layer disposed on an insulating material or covered with an insulating material. For example, the semiconductor substrate 100 may be a silicon wafer having a first conductivity type.

In some examples, the semiconductor integrated circuits formed on the chip regions 10 of the semiconductor substrate 100 may include semiconductor memory devices such as dynamic random access memory (DRAM) devices, static random access memory (SRAM) devices, NAND flash memory devices, or resistive random access memory (RRAM) devices. In certain examples, the semiconductor integrated circuits formed in the chip regions 10 of the semiconductor substrate 100 may include micro electro mechanical system (MEMS) devices, optoelectronic devices, or processors (e.g., central processing units (CPUs) or digital signal processors (DSPs)). In certain examples, the semiconductor integrated circuits formed on the chip regions 10 of the semiconductor substrate 100 may include standard cells including semiconductor components such as OR gates and/or AND gates. In addition, redistribution chip pads 141 used to input/output data or signals to/from the semiconductor integrated circuit and redistribution pads 143 used to input/output signals to/from test circuits may be provided on each of the chip regions 10.

Test element groups (TEGs) 30 for evaluating electrical characteristics of the semiconductor integrated circuits may be provided on the scribe line region 20 of the semiconductor substrate 100. Thus, each test element group (TEG) 30 may be referred to simply as a test circuit, such a circuit being configured to test one or more integrated circuits 101 in the chip regions 10. In addition, process control patterns 40 may be provided together with the test element groups 30 on the scribe line region 20. Here, the process control patterns 40 may include alignment patterns (e.g., various types of marks or keys) used as alignment references when performing various processes for manufacturing a semiconductor device (i.e., the semiconductor integrated circuit), and monitoring patterns used to monitor the various processes for manufacturing the semiconductor device.

Figure 3:
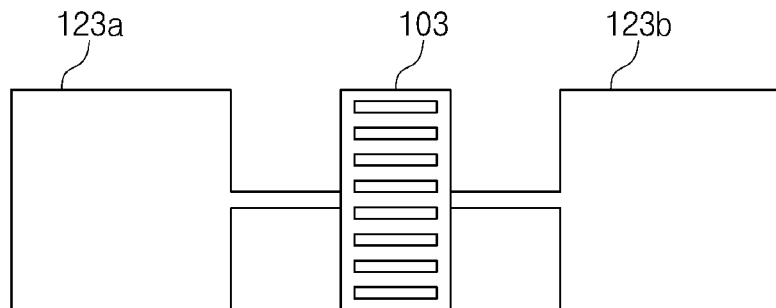
FIG. 3 is a schematic plan view of a test element group illustrated in FIG. 2.

FIG. 3 is a schematic plan view of a test element group illustrated in FIG. 2.

Referring to FIG. 3, each of the test element groups 30 may include at least one test structure 103 and a plurality of test pads 123a and 123b.

The test structure 103 may include at least one of various test circuits for testing the semiconductor integrated circuit formed on the chip region 10. For example, the test structure 103 may include an NMOS field effect transistor, a PMOS field effect transistor, or a resistor. A pair of the test pads 123a and 123b may be connected to the test structure 103 to input/output an electrical signal to/from the test structure 103.

Figure 4:
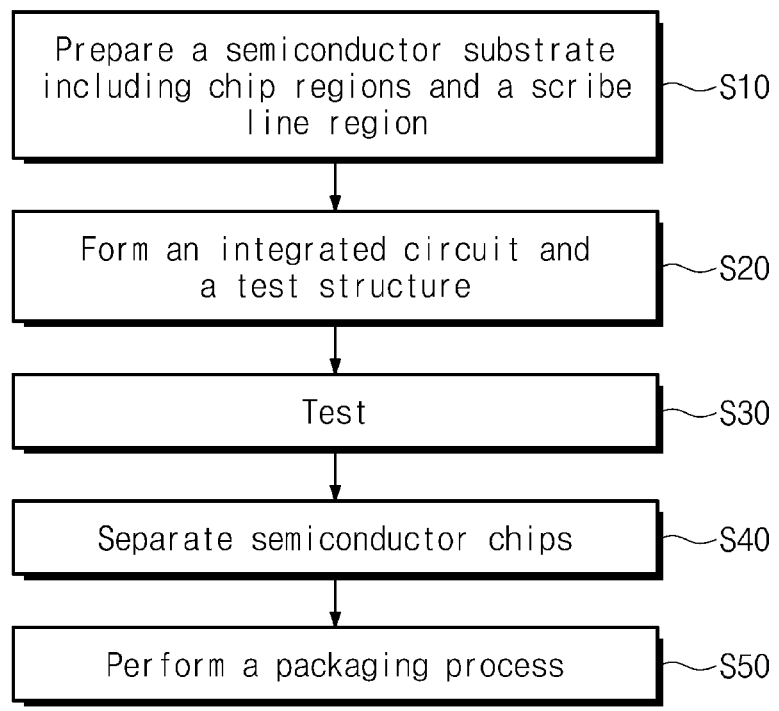
FIG. 4 is a flowchart of a method for manufacturing a semiconductor device, according to some examples of the inventive concepts.

FIG. 4 is a flowchart of a method for manufacturing a semiconductor device, according to some examples of the inventive concepts.

Referring to FIG. 4, a semiconductor substrate including a plurality of chip regions and a scribe line region may be prepared (S10). The chip regions and the scribe line region may be substantially the same as those described with reference to FIGS. 1 and 2.

Various processes for manufacturing a semiconductor device may be performed on the semiconductor substrate to form process control patterns, semiconductor integrated circuits, and test element groups (S20). In some examples, at least some of the process control patterns may be formed as references of the processes for manufacturing the semiconductor device, and thus each of the at least some of the process control patterns may be formed and then corresponding components of the semiconductor integrated circuits and the test element groups may be formed. On the scribe line region, the test element groups may be formed on regions different from regions on which the process control patterns are formed.

A test process may be performed using the test element groups after the semiconductor integrated circuits and the test element groups have been formed (S30). In the test process, electrical signals may be provided to the test structures of the test element groups through the test pads and electrical characteristics of the semiconductor integrated circuits may be evaluated through the test element groups.

After the test process, a sawing or dicing process may be performed along the cutting region of the scribe line region. Thus, the chip regions of the semiconductor substrate, on which the semiconductor integrated circuits are formed, may be separated from each other (S40). Each of the separated chip regions may correspond to a semiconductor chip.

Next, a packaging process may be performed on each of the individually separated semiconductor chips (S50).

FIG. 5 is an enlarged plan view of a portion of a semiconductor device according to some examples of the inventive concepts. FIGS. 6A to 6E are cross-sectional views taken in the direction of line I-I' of FIG. 5 to illustrate a method for manufacturing a semiconductor device, according to some examples of the inventive concepts.

Figure 6A:
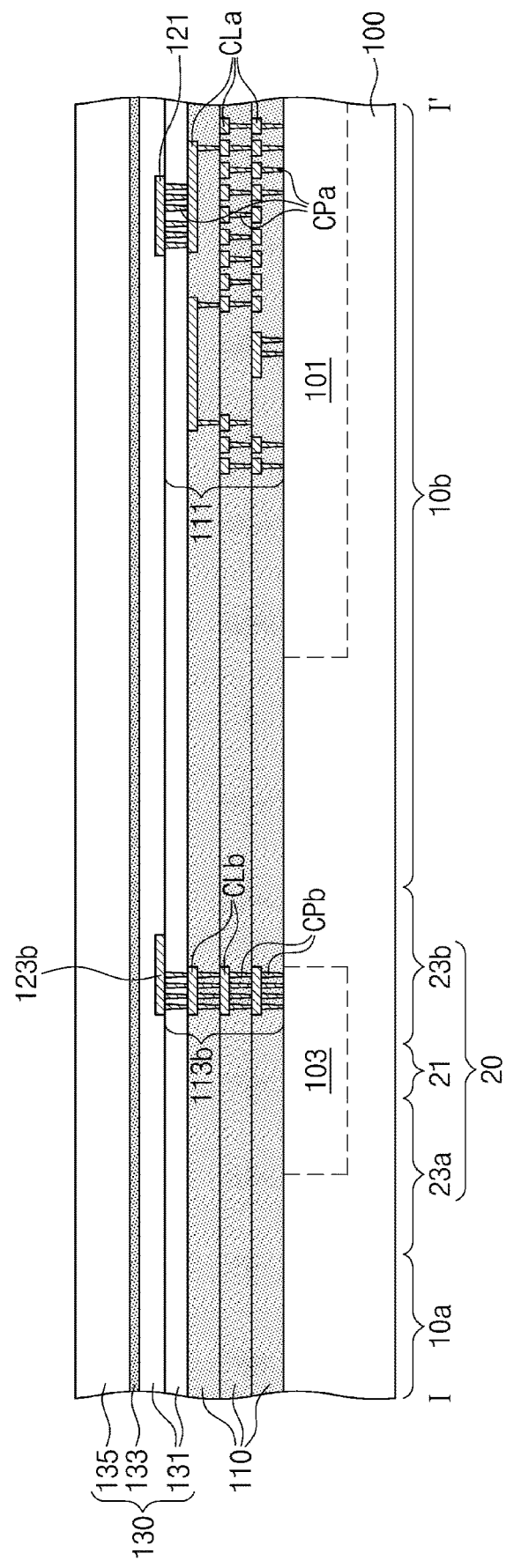
FIGS. 6A, 6B, 6C, 6D and 6E are cross-sectional views of a semiconductor device during the course of it manufacture taken in the direction of line I-I' of FIG. 5 and together illustrate a method for manufacturing a semiconductor device according to some examples of the inventive concepts.

Referring to FIGS. 5 and 6A, a semiconductor substrate 100 may include a plurality of chip regions 10a and 10b and a scribe line region 20. In more detail, first and second chip regions 10a and 10b may be adjacent to each other with the scribe line region 20 interposed therebetween, and the scribe line region 20 may include a first edge region 23a, a cutting region 21, and a second edge region 23b. The first edge region 23a may be disposed between the first chip region 10a and the cutting region 21, and the second edge region 23b may be disposed between the second chip region 10b and the cutting region 21.

A semiconductor integrated circuit 101 may be formed on each of the first and second chip regions 10a and 10b of the semiconductor substrate 100. The semiconductor integrated circuit 101 may include a memory cell array including switching elements and data storage elements, and logic elements including a MOS field effect transistor, a capacitor and a resistor.

A plurality of test structures 103 may be formed on the scribe line region 20 of the semiconductor substrate 100. In more detail, the test structures 103 may be spaced apart from each other in a direction D2 on the cutting region 21. The test structures 103 may be formed simultaneously with the semiconductor integrated circuits 101 of the chip regions 10a and 10b. The test structures 103 may include test circuits including substantially the same structures as at least some components of the semiconductor integrated circuits 101.

A lower insulating layer 110 may be formed on an entire top surface of the semiconductor substrate 100 having the semiconductor integrated circuits 101 and the test structures 103. The lower insulating layer 110 (or simply "lower device insulation") may be a multi-layered insulating structure and may be formed of a low-k dielectric material of which a dielectric constant is lower than that of a silicon oxide layer. The lower insulating layer 110 may have a dielectric constant of about 1.0 to about 3.0 and may include at least one of an organic material, an inorganic material, or an organic-inorganic hybrid material. In addition, the lower insulating layer 110 may be porous or non-porous. For example, the lower insulating layer 110 may be formed of an impurity-doped oxide-based material and/or a low-k organic polymer. Examples of suitable impurity-doped oxide-based materials include fluorine-doped oxides (or fluorosilicate glass (FSG)), carbon-doped oxides, silicon oxide, hydrogen silsesquioxane (SiO:H; HSQ), methyl silsesquioxane (SiO:CH3; MSQ), and a-SiOC (SiOC:H). Examples of suitable low-k organic polymers include polyallylether-based resins, cyclic fluorine resins, siloxane copolymers, polyallylether fluoride-based resins, polypentafluorostylene-based resins, polytetrafluorostylene-based resins, polyimide fluoride resins, polynaphthalene fluoride, and polycide resins. In addition, a barrier layer (not shown) may be provided between vertically adjacent ones of the layers making up the lower insulating layer 110. The barrier layer may include at least one insulating material selected from the group consisting of SiN, SiON, SiC, SiCN, SiOCH, SiOC, and SiOF.

An internal interconnection structure 111 electrically connected to the semiconductor integrated circuit 101 may be disposed in the lower insulating layer 110 on each of the chip regions 10a and 10b. The internal interconnection structure 111 may include first metal patterns CLa and first metal vias CPa. Each of the first metal vias CPa may penetrate at least a portion of the lower insulating layer 110 to connect first metal patterns CLa disposed at different levels to each other.

Connection structures 113a and 113b connected to the test structures 103 may be formed in the lower insulating layer 110 and on the scribe line region 20. The connection structures 113a and 113b may include second metal patterns CLb and second metal vias CPb connecting second metal patterns CLb disposed at different levels to each other. The connection structures 113a and 113b may be formed together with the internal interconnection structures 111 and may include the same metal material as the internal interconnection structures 111.

The internal interconnection structures 111 and the connection structures 113a and 113b may be formed of a first metal material. The first metal material may include at least one of a metal nitride (e.g., TiN, WN, TaN, or TaSiN) or a metal (e.g., W, Al, Ti, Ta, Co, or Cu). For example, the first metal material may include copper (Cu).

According to some examples, the connection structures 113a and 113b include a first connection structure 113a connected to one of the test structures 103 at a first end of the test structure 103 and a second connection structure 113b connected to one of the test structures 103 at a second end of the test structure 103. The first and second connection structures 113a and 113b may have substantially the same structure.

The first connection structures 113a may be spaced apart from each other and may be arranged at first intervals S1 in the direction D2 on the first edge region 23a. The second connection structures 113b may be spaced apart from each other and may be arranged at the first intervals S1 in the direction D2 on the second edge region 23b. In addition, the first and second connection structures 113a and 113b may be arranged asymmetrically. In other words, the second connection structures 113b may be offset from the first connection structures 113a in the direction D2. The first and second connection structures 113a and 113b connected to each of the test structures 103 may be spaced apart from (or offset from) each other by a second interval S2 in the direction D2, and the second interval S2 may be less than the first interval S1. For example, the second interval S2 may be about a half of the first interval S1.

Chip pads 121 may be connected to the internal interconnection structure 111 on each of the chip regions 10a and 10b, and test pads 123a and 123b may be connected to the connection structures 113a and 113b on the scribe line region 20.

The chip pads 121 may be electrically connected to the semiconductor integrated circuit 101 through the internal interconnection structure 111. The chip pads 121 may include data pads used to transmit/receive data signals, command/address pads used to transmit/receive command/address signals, and power source pads to be supplied with ground and/or power voltages. In some examples, the chip pads 121 may be used to test the semiconductor integrated circuit 101.

The test pads 123a and 123b may be electrically connected to the test structures 103 through the connection structures 113a and 113b. The test pads 123a and 123b may have the same size and may be spaced apart from each other in the direction D2 on the first and second edge regions 23a and 23b like the connection structures 113a and 113b. In other words, the test pads 123a or 123b disposed on each of the first and second edge regions 23a and 23b may be arranged at the first intervals S1 in the direction D2.

The chip pads 121 and the test pads 123a and 123b may be formed of a second metal material different from the first metal material. The second metal material may include at least one of a metal nitride (e.g., TiN, WN, TaN, or TaSiN) or a metal (e.g., W, Al, Ti, Ta, Co, or Cu). For example, the second metal material may include aluminum (Al).

An upper insulating layer 130 (or simply "upper device insulation") may be formed on the semiconductor substrate 100 and may cover the chip pads 121 and the test pads 123a and 123b on the lower insulating layer 110. In some examples, the upper insulating layer 130 may include an insulating material of which the strength is greater than that of the lower insulating layer 110. In addition, the upper insulating layer 130 may include an insulating material of which a dielectric constant is greater than that of the lower insulating layer 110. The upper insulating layer 130 may include at least one of a silicon oxide layer, a silicon nitride layer, or a silicon oxynitride layer. In more detail, the upper insulating layer 130 may include, for example, a silicon nitride (SiN) layer, a silicon oxynitride (SiON) layer, a silicon carbonitride (SiCN) layer, a high-density plasma (HDP) oxide layer, a tetraethylorthosilicate (TEOS) layer, a plasma enhanced tetraethylorthosilicate (PE-TEOS) layer, an O3-tetraethylorthosilicate (O3-TEOS) layer, an undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin on glass (SOG) layer, a Tonen silazene (TOSZ) layer, or any combination thereof.

In some examples, the upper insulating layer 130 may be a multi-layered structure. For example, the upper insulating layer 130 may include a first upper insulating layer 131, a second upper insulating layer 133 and a third upper insulating layer 135, which are sequentially stacked on the lower insulating layer 110. Here, the second upper insulating layer 133 may be formed of an insulating material having an etch selectivity with respect to the first and third upper insulating layers 131 and 135 and may be thinner than each of the first and third upper insulating layers 131 and 135. The first and third upper insulating layers 131 and 135 may be formed of different insulating materials from each other, and the third upper insulating layer 135 may be thicker than the first upper insulating layer 131. For example, the first upper insulating layer 131 may be an HDP oxide layer, the second upper insulating layer 133 may be a silicon nitride layer, and the third upper insulating layer 135 may be a TEOS layer.

Figure 6B:
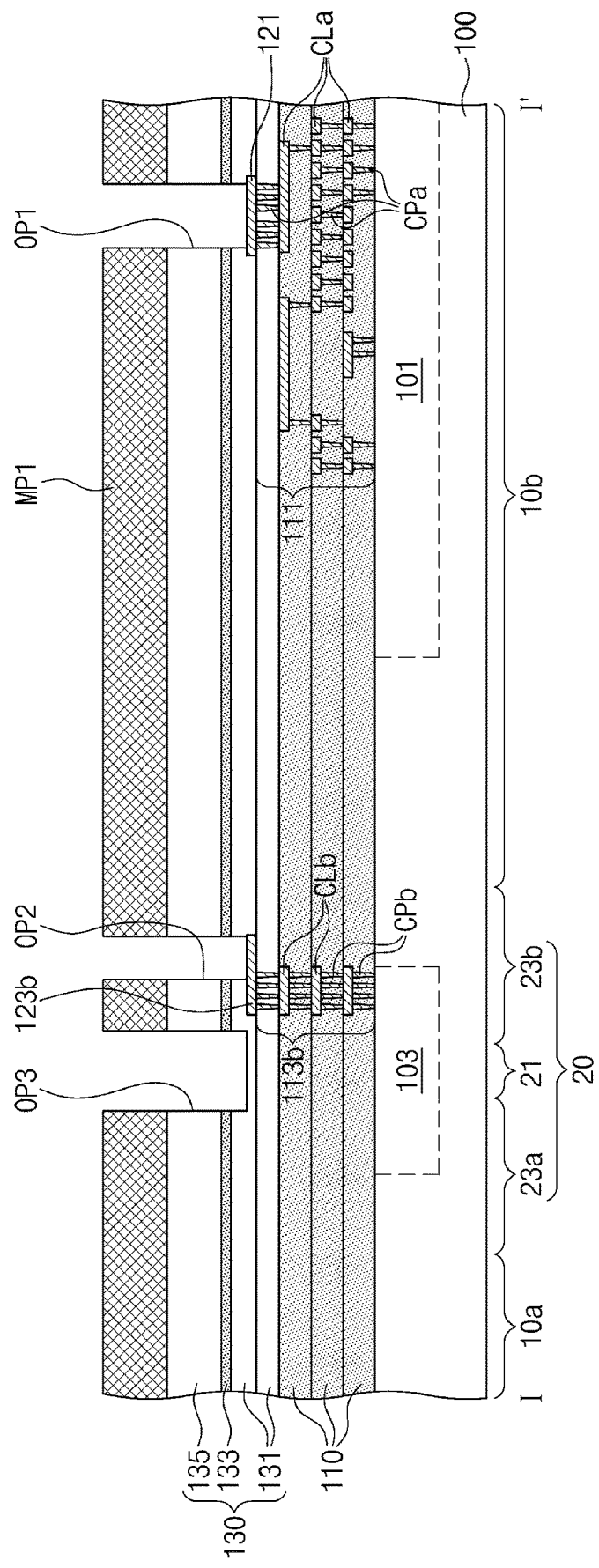

Referring to FIGS. 5 and 6B, the upper insulating layer 130 may be patterned to form first openings OP1 exposing the chip pads 121, second openings OP2 exposing the test pads 123a and 123b, and a third opening OP3 provided on the cutting region 21. The process of forming of the first to third openings OP1, OP2 and OP3 may include forming a first mask pattern MP1 having openings on the upper insulating layer 130, and anisotropically etching portions of the upper insulating layer 130 using the first mask pattern MP1 as an etch mask. The first mask pattern MP1 may be removed after the first to third openings OP1, OP2 and OP3 have been formed.

On each of the chip regions 10a and 10b, the first openings OP1 may have substantially the same size and may be arranged at substantially equal intervals. On each of the edge regions 23a and 23b, the second openings OP2 may have substantially the same size and may be arranged at substantially equal intervals. According to some examples, a width of the second opening OP2 may be less than a width of the first or third opening OP1 or OP3. Since the third opening OP3 is formed in the upper insulating layer 130 on the cutting region 21, a thickness of the upper insulating layer 130 on the cutting region 21 may be less than a thickness of the upper insulating layer 130 on the chip regions 10a and 10b.

Figure 6C:
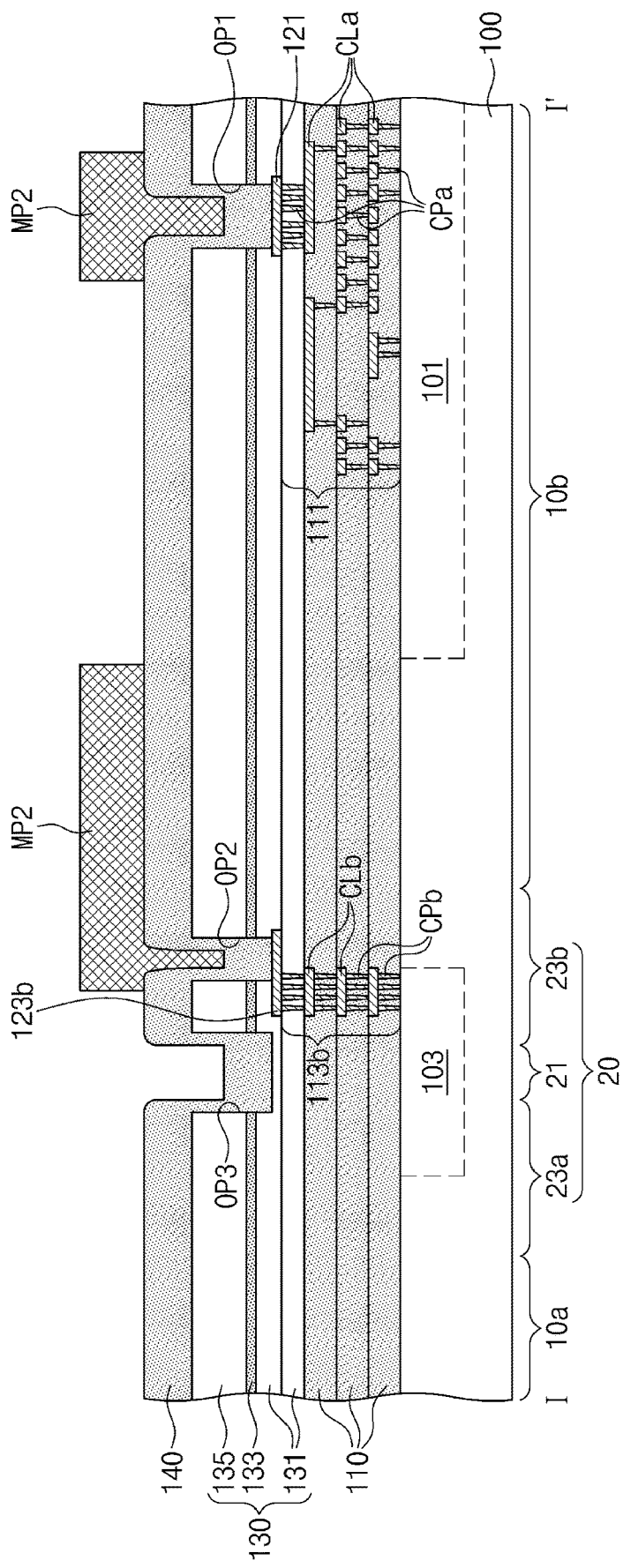

Referring to FIGS. 5 and 6C, a redistribution layer 140 may be formed on the upper insulating layer 130 having the first to third openings OP1, OP2 and OP3. The process of forming the redistribution layer 140 may include forming a metal seed layer conformally covering a surface of the upper insulating layer 130 having the first to third openings OP1, OP2 and OP3, and forming a metal layer on the metal seed layer. The metal seed layer and the metal layer may be formed by a deposition method such as an electroplating method, an electroless plating method, and/or a sputtering method. For example, the redistribution layer 140 may be formed of a metal or metal alloy including at least one material selected from a group consisting of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C). In some examples, the redistribution layer 140 may include a second metal material different from the first metal material of the internal interconnection structures 111 and the connection structures 113a and 113b. For example, the redistribution layer 140 may include aluminum (Al).

The redistribution layer 140 may partially fill the first to third openings OP1, OP2 and OP3. The redistribution layer 140 may be in contact with the chip pads 121 in the first openings OP1 and may be in contact with the test pads 123a and 123b in the second openings OP2.

After the process of forming the redistribution layer 140, second mask patterns MP2 may be formed on the redistribution layer 140. The second mask patterns MP2 may cover the chip pads 121 and the test pads 123a and 123b. Subsequently, the redistribution layer 140 may be patterned using the second mask patterns MP2 as an etch mask. In other words, the redistribution layer 140 exposed by the second mask patterns MP2 may be etched.

Figure 6D:
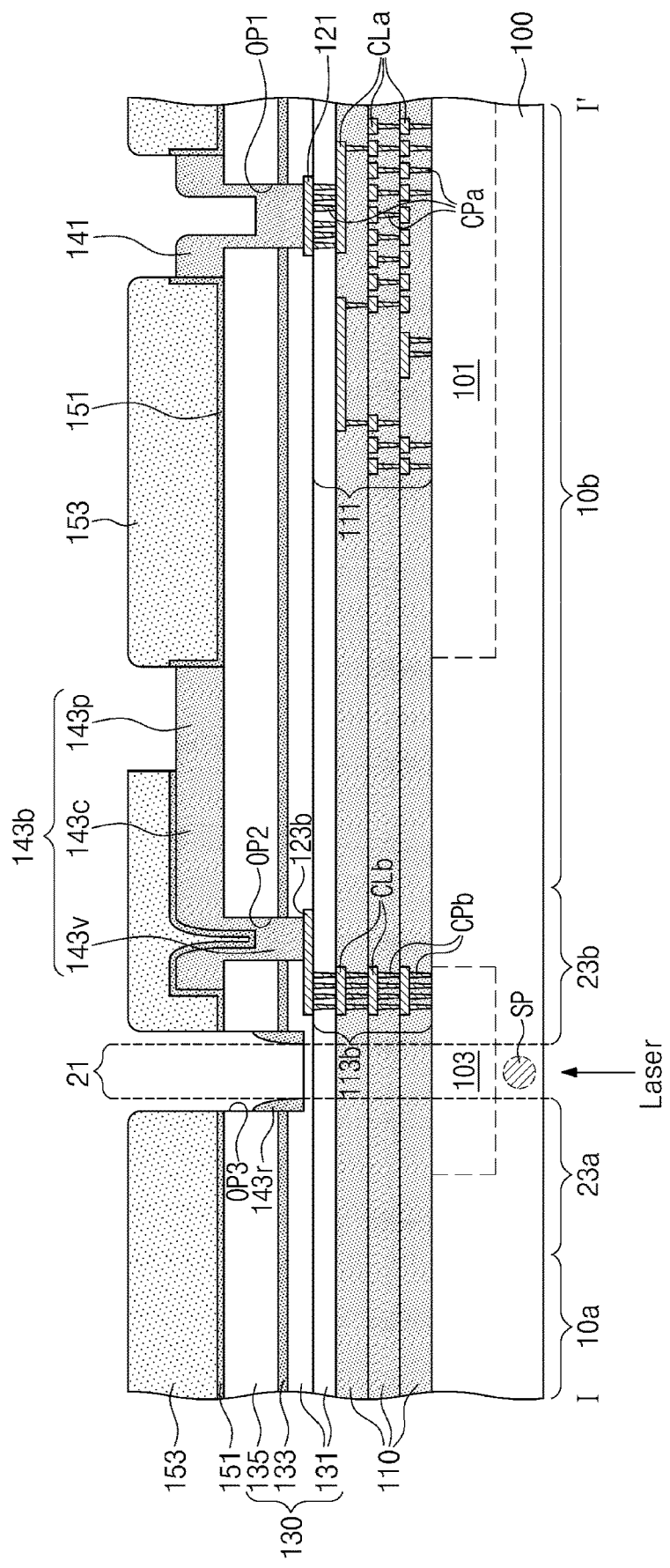

Thus, as illustrated in FIGS. 5 and 6D, redistribution chip pads 141 connected to the chip pads 121 may be formed, and redistribution pads 143a and 143b connected to the test pads 123a and 123b may be formed. In addition, the redistribution layer 140 may be removed from the bottom of the third opening OP3 by the etching process of forming the redistribution chip pads 141 and the redistribution pads 143a and 143b. In some examples, a portion 143r of the redistribution layer may remain along sides of the third opening OP3 after the etching process.

Referring to FIGS. 5 and 6D, the redistribution pads 143a and 143b may have substantially the same structure. The redistribution pads 143a and 143b may include first redistribution pads 143a connected to the first test pads 123a disposed on the first edge region 23a, and second redistribution pads 143b connected to the second test pads 123b disposed on the second edge region 23b. The first redistribution pads 143a may be spaced apart from each other and may be arranged at the first intervals S1 in the direction D2 on the first edge region 23a, like the first test pads 123a. The second redistribution pads 143b may be spaced apart from each other and may be arranged at the first intervals S1 in the direction D2 on the second edge region 23b. In the example illustrated in FIG. 5, the number of the connection structures 113a or 113b and the number of the redistribution pads 143a or 143b on each of the edge regions 23a and 23b may be equal to the number of the test structures 103 in the test element group 30.

In more detail, as illustrated in FIGS. 5 and 6D, each of the redistribution pads 143a and 143b may include a via portion 143v (or "conductive via") disposed on each of the edge regions 23a and 23b, a pad portion 143p (or "conductive pad") disposed on each of the chip regions 10a and 10b, and a line portion 143c (or "conductive line-shaped portion") connecting the via portion 143v to the pad portion 143p. The via portion 143v may penetrate the upper insulating layer 130 on each of the edge regions 23a and 23b so as to be connected to each of the test pads 123a and 123b. The line portion 143c may be disposed on a top surface of the upper insulating layer 130 and may extend in a direction D1 intersecting a longitudinal direction of the scribe line region 20 (i.e., the direction D2 in the representative portion of the device). Despite the numbering, the direction D2 may be referred to as a first direction and the direction D1 may be referred to as the second direction including throughout the description that follows. A width of the pad portion 143p may be greater than a width of the line portion 143c and a width of the via portion 143v, and the width of the via portion 143v may be less than a width of the test pad 123a or 123b.

In some examples, the line portions 143c of the redistribution pads 143a and 143b may have substantially the same length in the direction D1. In other words, the pad portions 143p of the first redistribution pads 143a may be spaced apart from the first connection structures 113a or the first test pads 123a by a first distance d in the direction D1 when viewed in a plan view. Here, as shown in the figure, the distance d may refer to a (geometric) center-to-center distance between the pad portions 143p of the first redistribution pads 143a and the first connection structures 113a as viewed in a plan view. The distance d may also refer to the distance between the geometric center of the pad portions 143p of the first redistribution pads 143a and the centers of contact between the first redistribution pads 143a and the first test pads 123a as viewed in a plan view. Or the distance d may simply correspond to the length of the line portions 143c. That is, the pad portions 143p of the second redistribution pads 143b may be spaced apart from the second connection structures 113b or the second test pads 123b in the direction D1 when viewed in a plan view.

Next, a protective layer 151 and a passivation layer 153 may be sequentially formed on an entire top surface of the semiconductor substrate 100. The protective layer 151 may be a silicon nitride layer or a silicon oxynitride layer. The passivation layer 153 may be formed of a polyimide-based material such as photosensitive polyimide (PSPI). The passivation layer 153 may be formed on the protective layer 151 by a spin-coating process and may be patterned through an exposure process without an additional photoresist layer. In other words, a portion of the redistribution chip pad 141 and the pad portions 143p of the redistribution pads 143a and 143b may be exposed by the passivation layer 153. In addition, the passivation layer 153 may be patterned to expose the third opening OP3 of the upper insulating layer 130 on the cutting region 21 again.

After the process of forming of the redistribution chip pad 141 and the redistribution pads 143a and 143b, the test process may be performed as described above with reference to FIG. 4. In certain examples, the test process may be performed before the process of forming of the protective layer 151 and the passivation layer 153.

Probe pins of a probe card may be placed in contact with the redistribution pads 143a and 143b, and test signals may be applied to the redistribution pads 143a and 143b through the probe pins to perform the test process. According to the examples, it is possible to secure integrity or consistency of values measured in the test process performed on the test structures 103 because the connection structure 113a or 113b and the redistribution pad 143a or 143b connected to the test structure 103 on the edge region 23a or 23b constitute an integrated structure. Referring again to FIG. 6D, after the test process, the semiconductor substrate 100 may be cut along the cutting region 21 by a cutting process. In more detail, the cutting region 21 may be irradiated with a laser beam through a back surface of the semiconductor substrate 100. Thus, physical properties of the semiconductor substrate 100 may be changed in a spot region SP irradiated by the laser beam. Thus, the physical strength of the semiconductor substrate 100 may be reduced in the irradiated spot region SP. Subsequently, the semiconductor substrate 100 may be placed on a thin tape (not shown), and then, the thin tape is stretched horizontally, thereby applying a force to the semiconductor substrate 100 that severs the substrate 100 along the cutting region 21. Alternatively, the semiconductor substrate 100 may be mechanically cut completely therethrough along the cutting region 21, and thus the chip regions 10a and 10b may be separated from each other. Here, the cutting process may be performed using a rotating circular saw blade or laser through an ablation process.

According to the examples of the inventive concepts, the connection structures 113a and 113b and the redistribution pads 143a and 143b, which are connected to the test structures 103, are not be disposed on the cutting region 21 but on the edge regions 23a and 23b and the chip regions 10a and 10b. Thus, areas of the redistribution pads 143a and 143b on the scribe line region 20 are minimized. As a result, when the semiconductor substrate 100 is cut along the cutting region 21, it is possible to prevent the semiconductor substrate 100 from being cut non-uniformly, and/or it is possible to prevent a crack from occurring at the separated chip regions 10a and 10b. In addition, the semiconductor substrate 100 may be easily cut because the upper insulating layer 130 on the cutting region 21 is thinner than the upper insulating layer 130 on the edge regions 23a and 23b and the chip regions 10a and 10b.

Figure 6E:
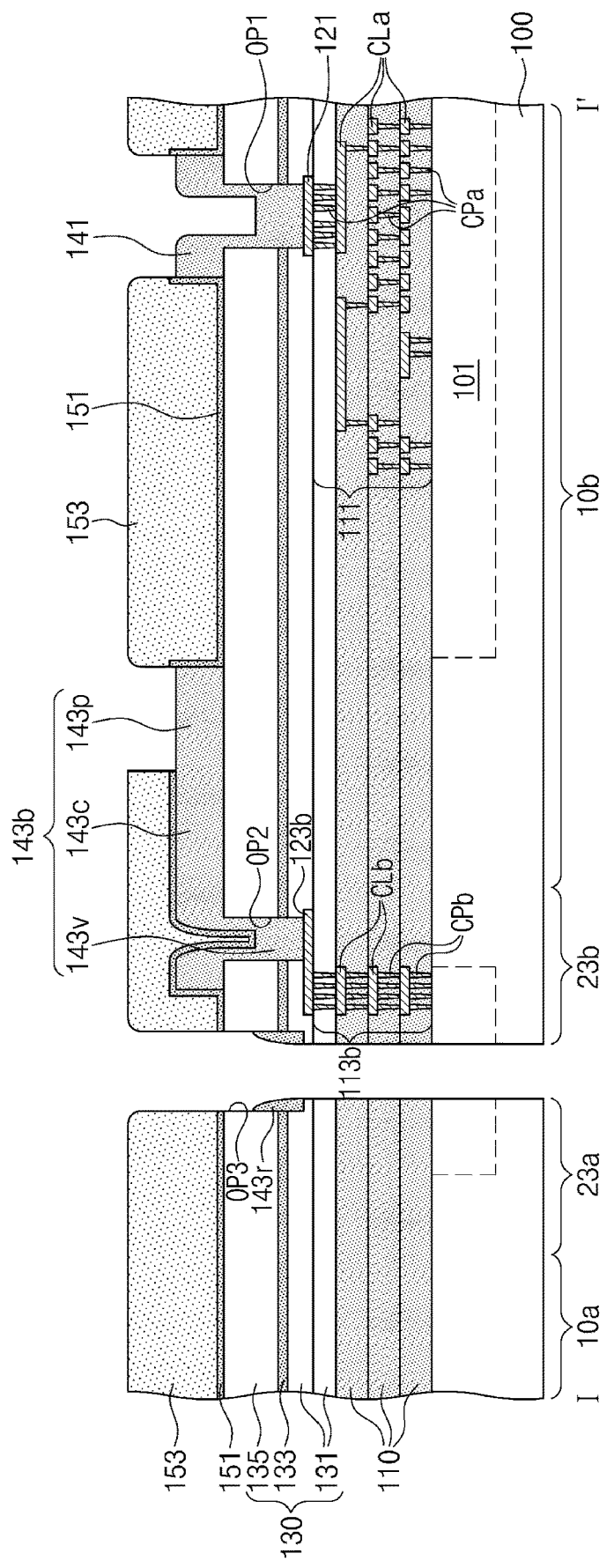

Referring to FIG. 6E, the semiconductor substrate 100 may be divided into a plurality of semiconductor devices (or semiconductor chips) by the cutting process. Each of the semiconductor devices (or the semiconductor chips) may include one of the chip regions 10a and 10b on which a semiconductor integrated circuit 101 has been formed.

In more detail, each of the semiconductor devices separated from each other may include one chip region 10a or 10b and the edge region 23a or 23b around the chip region 10a or 10b, and the connection structures 113a or 113b and the test pads 123a or 123b may remain on the edge region 23a or 23b. In addition, the redistribution pads 143a or 143b connected to the test pads 123a or 123b may remain on the upper insulating layer 130. In certain examples, portions of the connection structures 113a or 113b may be exposed after the cutting process.

Figure 8:
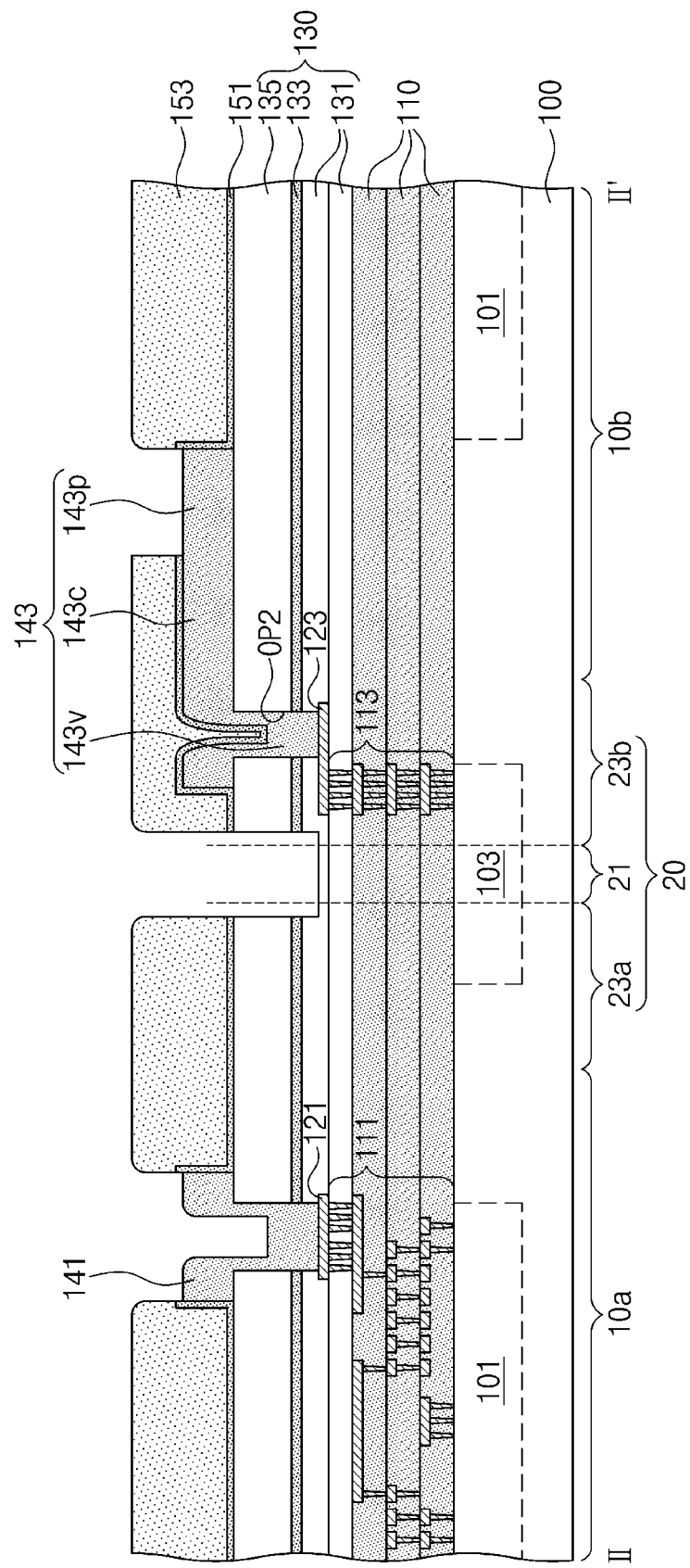
FIG. 8 is a cross-sectional view taken along a line II-II' of FIG. 6 to illustrate a semiconductor device according to some examples of the inventive concepts.

FIG. 7 is an enlarged plan view of a portion of a semiconductor device according to some examples of the inventive concepts. FIG. 8 is a cross-sectional view taken along a line II-II' of FIG. 6 to illustrate a semiconductor device according to some examples of the inventive concepts. Hereinafter, descriptions of the same technical features as in the above examples of FIGS. 5 and 6A to 6E will be omitted or mentioned briefly for the sake of brevity.

Referring to FIGS. 7 and 8, the first and second chip regions 10a and 10b may be adjacent to each other with the scribe line region 20 interposed therebetween, the first edge region 23a may be disposed between the first chip region 10a and the cutting region 21, and the second edge region 23b may be disposed between the second chip region 10b and the cutting region 21. As described above, the test element group 30 including the plurality of test structures 103 may be provided on the scribe line region 20. The test structures 103 may be electrically connected to redistribution pads 143 through connection structures 113 and test pads 123. In the present example, the redistribution pads 143 are disposed on one of the chip regions 10a and 10b adjacent to the scribe line region 20.

In more detail, the redistribution chip pads 141 of the first chip region 10a may be adjacent to the first edge region 23a, and the redistribution pads 143 of the second chip region 10b may be adjacent to the second edge region 23b. The redistribution chip pads 141 of the first chip region 10a may be arranged to face the redistribution pads 143 of the second chip region 10b.

The connection structures 113 connected to the test structures 103 may be arranged at the first intervals S1 in the first direction D2 on the second edge region 23b. The redistribution pads 143 may also be arranged at the first intervals S1 in the direction D2 on the second edge region 23b and the second chip region 10b adjacent to the second edge region 23b. As described above, each of the redistribution pads 143 may include the via portion 143v, the line portion 143c, and the pad portion 143p, and the redistribution pads 143 may have substantially the same size. The pad portions 143p of the redistribution pads 143 may be spaced apart from the connection structures 113 by a constant distance d in the second direction D1 when viewed in a plan view. A distance between the pad portions 143p of the redistribution pads 143 adjacent to each other may be less than a distance between the connection structures 113 adjacent to each other.

The number of the connection structures 113 arranged on the second edge region 23b may be equal to the number of the redistribution pads 143 arranged on the second chip region 10b. In some examples, N connection structures 113 and N redistribution pads 143 may be provided on the second edge region 23b and the second chip region 10b, and 'N' may be twice the number of the test structures 103.

As described above, the chip regions 10a and 10b of the semiconductor substrate 100 may be separated from each other by the sawing process after the test process. Because the connection structures 113, the test pads 123 and the redistribution pads 143 are not disposed on the cutting region 21, the scribe line region 20 may be completely cut and cracks may be prevented from forming in the chip regions 10a and 10b.

Figure 9:
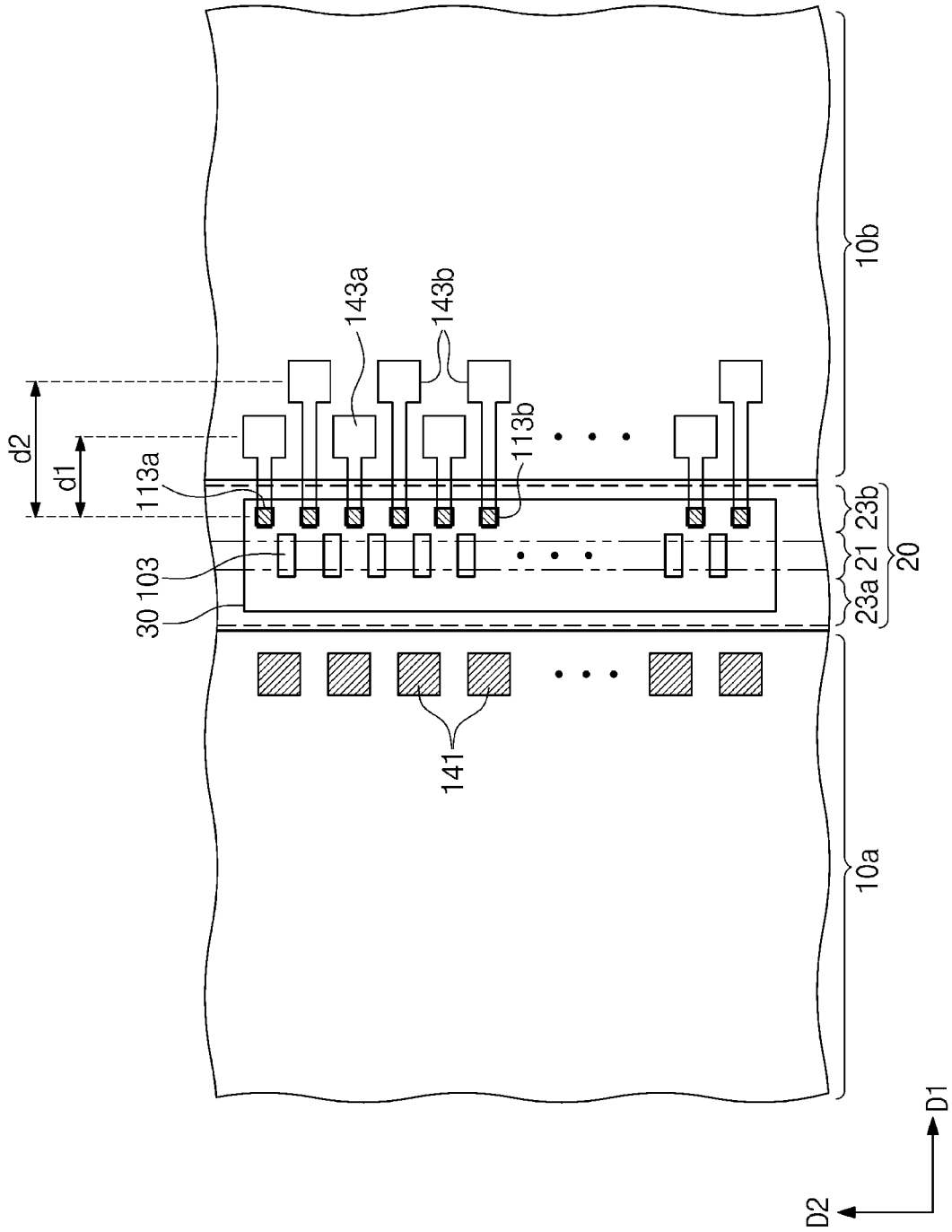
FIG. 9 is an enlarged plan view of a portion of a semiconductor device according to some examples of the inventive concepts.

FIG. 9 is an enlarged plan view of a portion of a semiconductor device according to some examples of the inventive concepts. Hereinafter, for the sake of brevity, descriptions of the same technical features as in the examples of FIGS. 7 and 8 will be omitted or mentioned briefly and differences between the present examples and the examples of FIGS. 7 and 8 will be mainly described.

Referring to FIG. 9, connection structures 113a and 113b are arranged in a line in the first direction D2 on the second edge region 23b, and redistribution pads 143a and 143b are arranged in two lines in the direction D2.

In more detail, first connection structures 113a and second connection structures 113b may be alternately arranged in the direction D2 on the second edge region 23b. The number of the first connection structures 113a and the number of the second connection structures 113b may be equal to the number of the test structures 103.

First redistribution pads 143a may be connected to the first connection structures 113a, respectively, and second redistribution pads 143b may be connected to the second connection structures 113b, respectively. The first redistribution pads 143a may be arranged at equal intervals in the direction D2, and the second redistribution pads 143b may also be arranged at equal intervals in the direction D2.

As described above, each of the first and second redistribution pads 143a and 143b may include the via portion 143v, the line portion 143c, and the pad portion 143p. Here, the pad portions 143p of the first and second redistribution pads 143a and 143b may have substantially the same width, but the line portions 143c of the second redistribution pads 143b may be longer than the line portions 143c of the first redistribution pads 143a in the second direction D1. In other words, the pad portions 143p of the first redistribution pads 143a may be spaced apart from the first connection structures 113a by a first distance d1 in the direction D1 when viewed in a plan view. The pad portions 143p of the second redistribution pads 143b may be spaced apart from the second connection structures 113b by a second distance d2 greater than the first distance d1 in the direction D1 when viewed in a plan view.

Because the first and second redistribution pads 143a and 143b are arranged as described above, the number of the redistribution pads 143a and 143b per unit area may be maximized, and a process margin of the redistribution process may be secured or improved.

Figure 10:
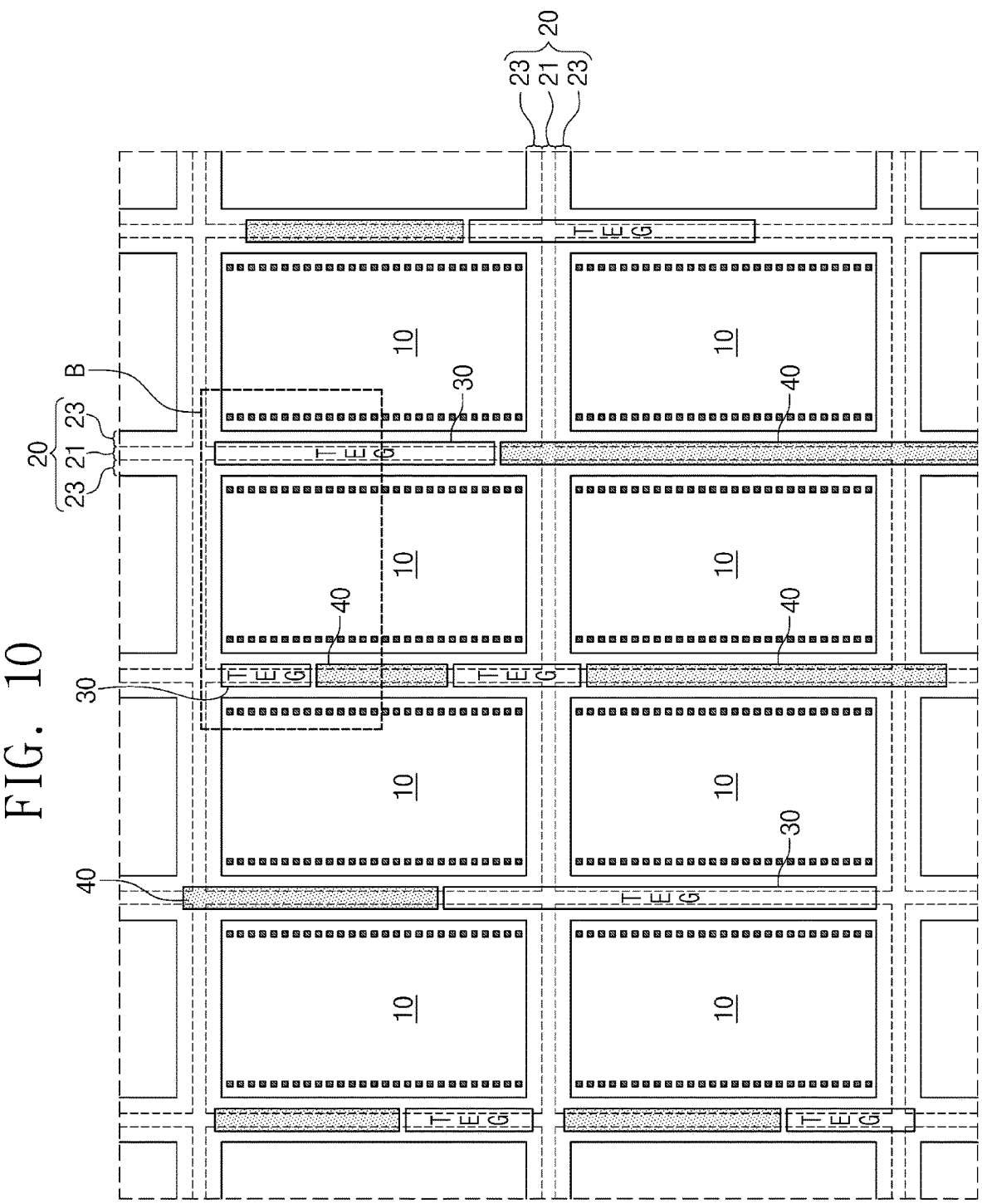
FIG. 10 is a plan view of a portion of a substrate on which semiconductor devices according to some examples of the inventive concepts are integrated.
Figure 11:
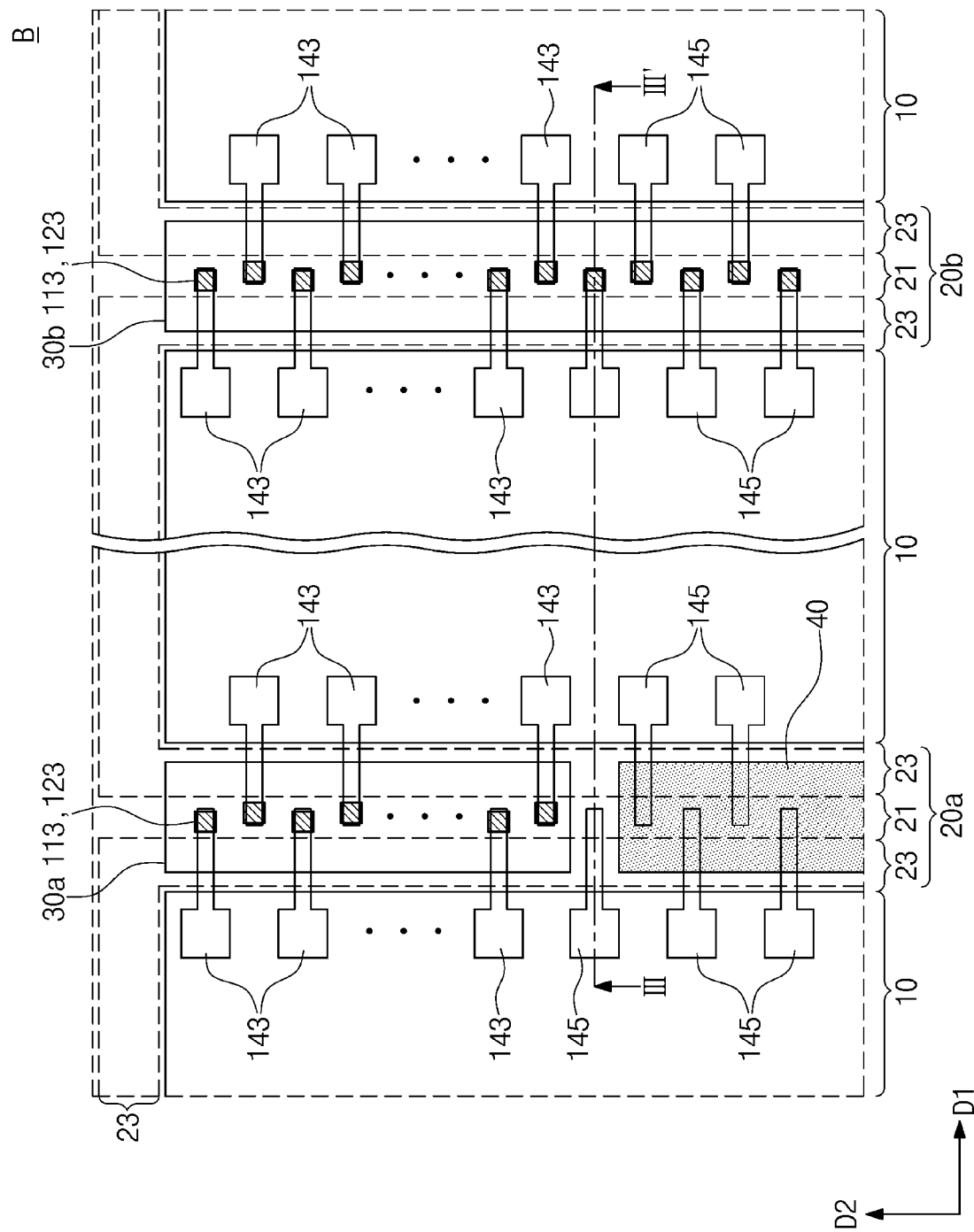
FIG. 11 is an enlarged view of a portion 'B' of FIG. 10.
Figure 12:
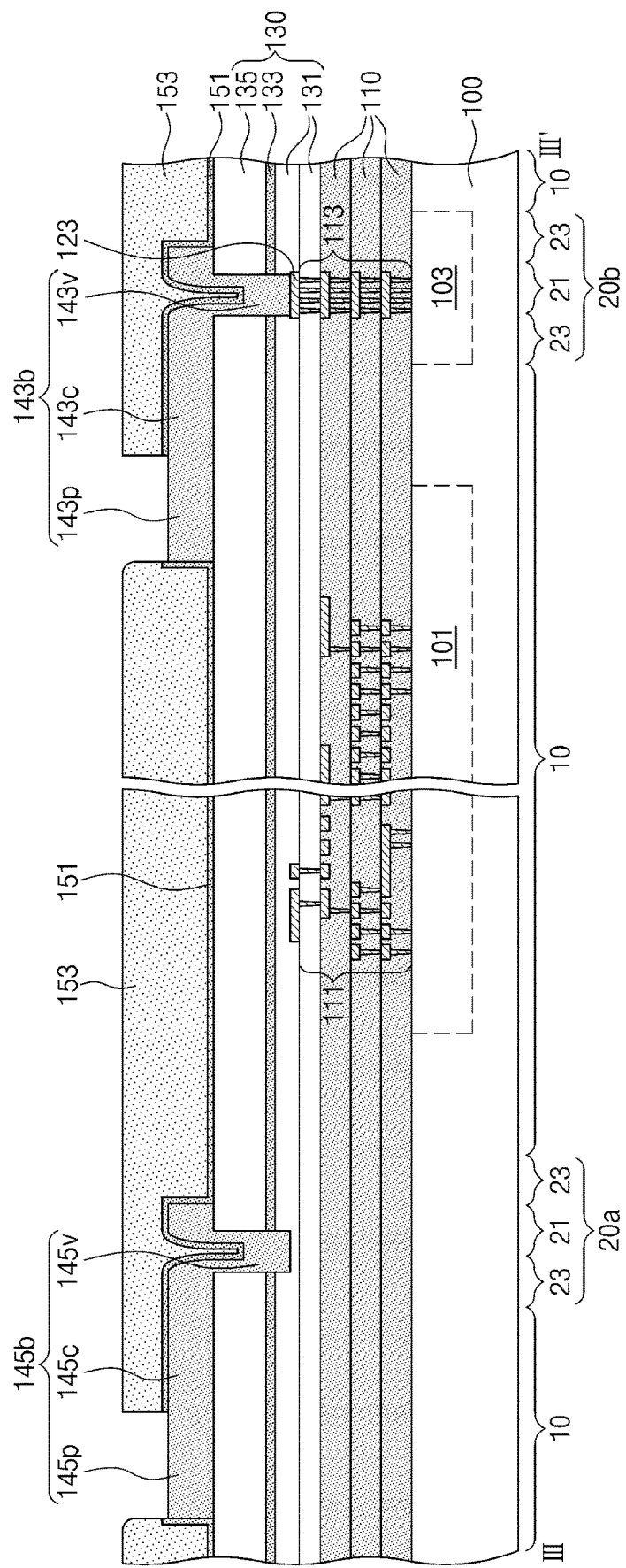
FIG. 12 is a cross-sectional view taken along line of FIG. 11.

FIG. 10 is a plan view of a portion of a substrate on which semiconductor devices according to some examples of the inventive concepts are integrated. FIG. 11 is an enlarged view of a portion 'B' of FIG. 10. FIG. 12 is a cross-sectional view taken along a line of FIG. 11. Hereinafter, for the sake of brevity, descriptions of the same technical features as in the above examples will be omitted or mentioned briefly and differences between the present examples and the above examples will be mainly described.

Referring to FIGS. 10, 11 and 12, test element groups 30 and process control patterns 40 may be provided on the scribe line region 20. The test element groups 30 are formed in the spaces in the scribe line region 20 left vacant by the process control patterns 40. Accordingly, the sizes of at least some of the test element groups 30 may be different from each other.

In more detail, the semiconductor substrate 100 may include a first scribe line region 20a and a second scribe line region 20b, which are opposite to each other with the chip region 10 interposed therebetween. In some examples, a first test element group 30a and the process control pattern 40 may be provided on the first scribe line region 20a, and a second test element group 30b may be provided on the second scribe line region 20b. Here, the number of test structures 103 in the first test element group 30a may be different from the number of test structures 103 in the second test element group 30b. For example, the number of the test structures 103 in the first test element group 30a may be less than the number of the test structures 103 in the second test element group 30b.

According to some examples, redistribution pads 143 and redistribution dummy pads 145 may be regularly provided on the chip region 10 adjacent to the scribe line regions 20a and 20b. In more detail, the redistribution pads 143 may be arranged at the first intervals in the first direction D2. The redistribution dummy pads 145 may be spaced apart from one of the redistribution pads 143 in the direction D2. The redistribution dummy pads 145 may have the same size and the same structure as the redistribution pads 143. In other words, each of the redistribution dummy pads 145 may include a dummy via portion 145v, a dummy line portion 145c, and a dummy pad portion 145p, like the redistribution pad 143.

The connection structures 113 of the first test element group 30a may be connected to the redistribution pads 143, respectively. The connection structures 113 of the second test element group 30b may be connected to the redistribution pads 143 and the redistribution dummy pads 145, respectively.

The redistribution dummy pads 145 adjacent to the first scribe line region 20a may not be connected to the connection structures and may be disposed on the upper insulating layer 130. In this case, bottom surfaces of the dummy via portions 145v of the redistribution dummy pads 145 may be in contact with the upper insulating layer 130. The redistribution dummy pads 145 adjacent to the second scribe line region 20b may be connected to some of the connection structures 113 of the second test element group 30b, respectively.

In some examples, the position of the first test element group 30a and the position of the process control pattern 40 are interchanged. In this case, the connection structures 113 of the first test element group 30a may be connected to the redistribution dummy pads 145. In other words, even though the position of the first test element group 30a is changed, the test structures 103 of the first test element group 30a may be tested through the redistribution dummy pads 145. In addition, even though a greater number of the test structures 103 in the first test element group 30a are provided, the test structures 103 may be tested through the redistribution dummy pads 145 and the redistribution pads 143.

FIGS. 13A to 13F are plan views of portions of substrates having integrated semiconductor devices according to some examples of the inventive concepts.

According to some examples of the inventive concepts, positions of the redistribution pads 143 connected to the test structures 103 may be dependent on the arrangement of the redistribution chip pads 141 connected to the semiconductor integrated circuits 101. Various layouts of the redistribution chip pads 141 and the redistribution pads 143 will be described with reference to FIGS. 13A to 13F. In addition, for the sake of brevity, descriptions of the same technical features as in the above examples will be omitted or mentioned briefly and differences between the present examples and the above examples will be mainly described hereinafter.

Referring to FIGS. 13A to 13F, a plurality of the chip regions 10 may be arranged on the semiconductor substrate 100 in the second direction D1 and the first direction D2. The chip regions 10 may be defined by the scribe line regions 20 extending in the first and second directions D1 and D2, which intersect each other. Each of the chip regions 10 may have first to fourth sides S1, S2, S3 and S4. The first and third sides S1 and S3 may be parallel to the direction D2, and the second and fourth sides S2 and S4 may be parallel to the direction D1. The first and third sides S1 and S3 may be opposite to each other, and the second and fourth sides S2 and S4 may be opposite to each other.

Each of the chip regions 10 may include a first pad region 11 on which the redistribution chip pads 141 are provided; and a second pad region 13 on which the redistribution pads 143 and the redistribution dummy pads 145 are provided.

Figure 13A:
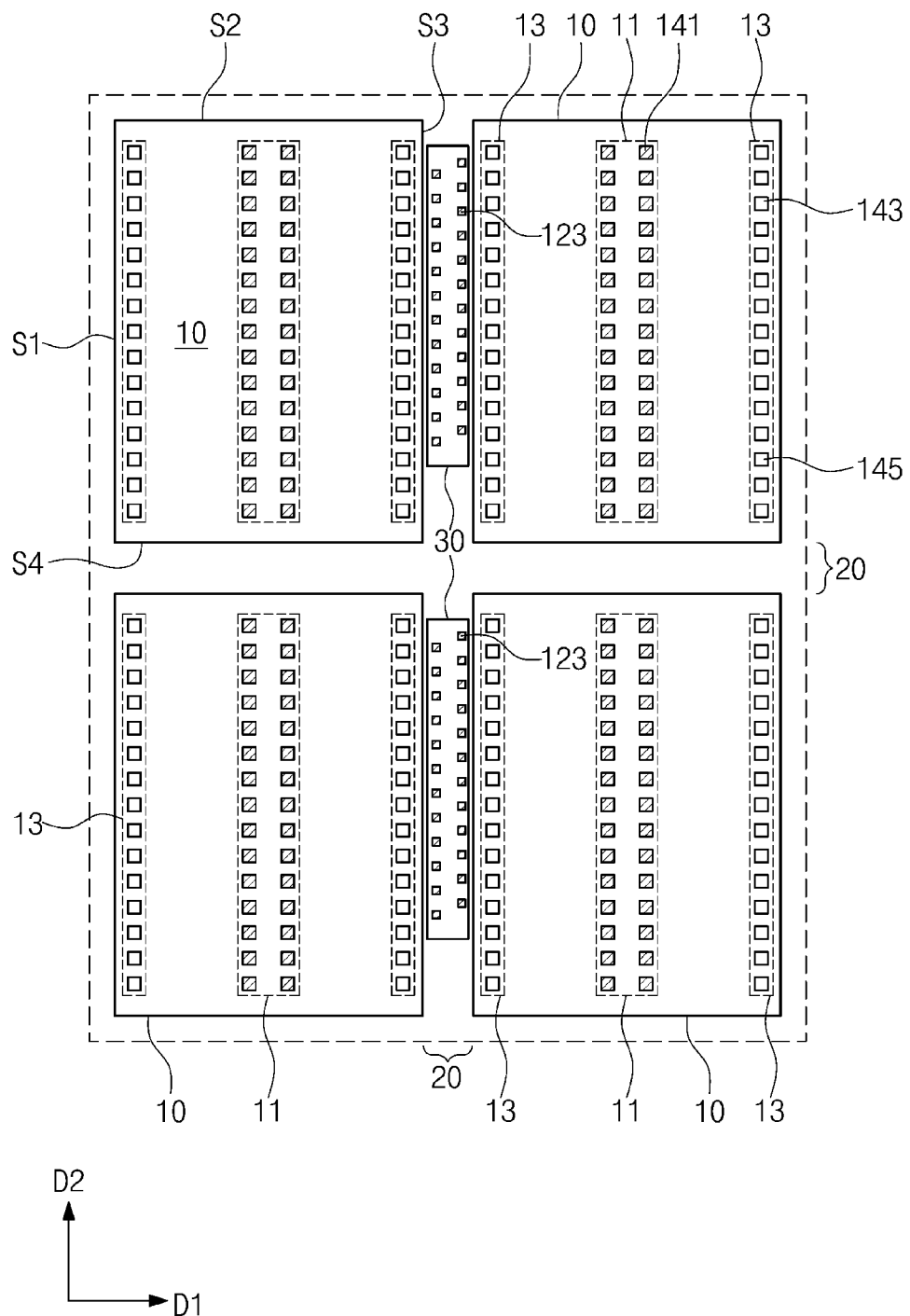
FIGS. 13A, 13B, 13C, 13D, 13E and 13F are plan views of portions of substrates having integrated semiconductor devices according to some examples of the inventive concepts.

According to the example illustrated in FIG. 13A, the test element groups 30 are disposed on the scribe line region 20 between the chip regions 10 adjacent to each other in the second direction D1. The first pad region 11 is disposed at a central portion of each of the chip regions 10, and the second pad regions 13 is disposed adjacent to the first and third sides S1 and S3 of the chip region 10, respectively. The redistribution chip pads 141 are spaced apart from each other and arranged in the first direction D2 on the first pad region 11. The redistribution pads 143 and the redistribution dummy pads 145 are spaced apart from each other and arranged in the direction D2 on the second pad region 13. As described above, the redistribution pads 143 and 145 are connected to the test pads 123 of the test element group 30 adjacent to each of the first and third sides S1 and S3 of the chip region 10.

Figure 13B:
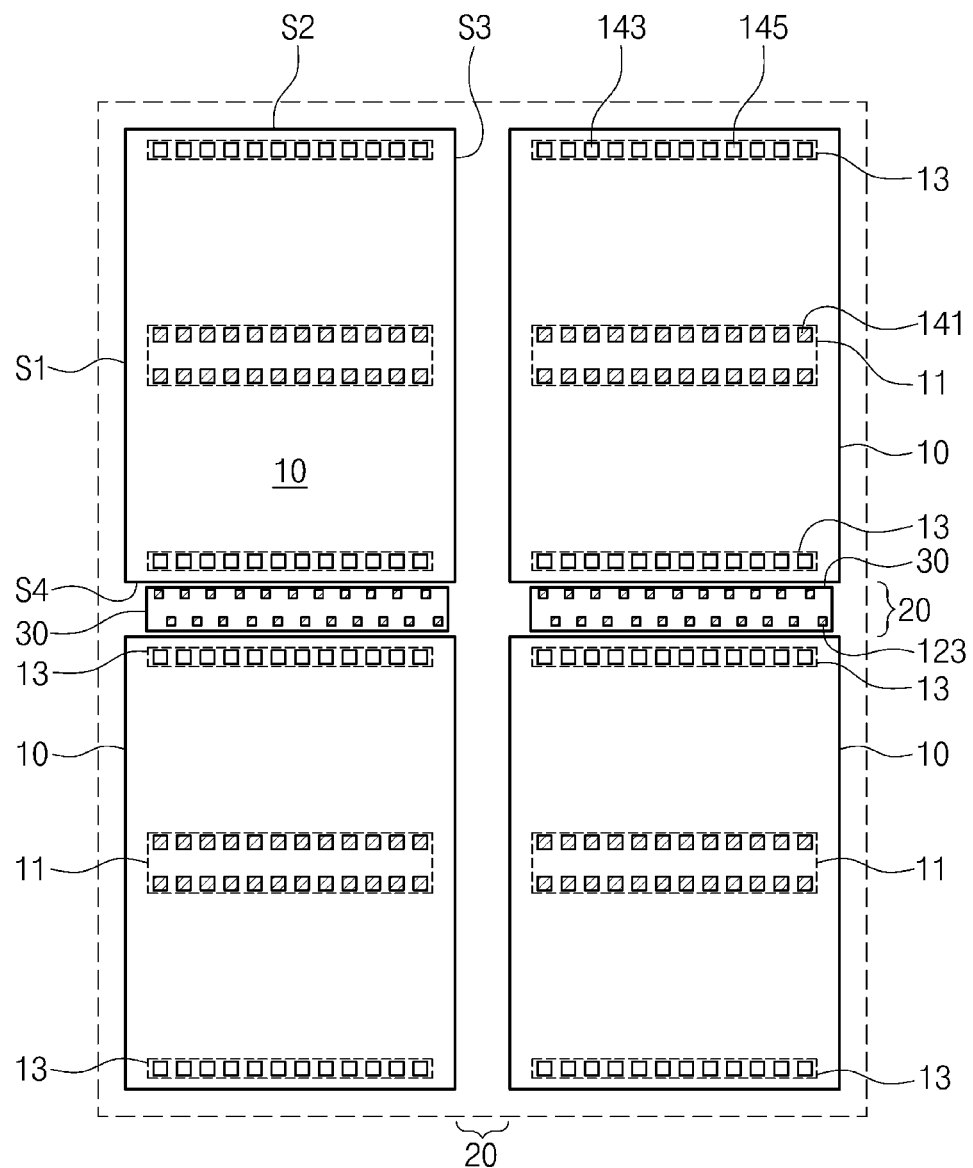

According to the example illustrated in FIG. 13B, the test element groups 30 are disposed on the scribe line region 20 between the chip regions 10 adjacent to each other in the first direction D2. The first pad region 11 is disposed at a central portion of each of the chip regions 10, and the second pad regions 13 are disposed adjacent to the second and fourth sides S2 and S4 of the chip region 10, respectively. The redistribution chip pads 141 are spaced apart from each other and arranged in the second direction D1 on the first pad region 11. The redistribution pads 143 and the redistribution dummy pads 145 are spaced apart from each other and arranged in the direction D1 on the second pad region 13. The redistribution pads 143 and 145 are connected to the test pads 123 of the test element group 30 adjacent to each of the second and fourth sides S2 and S4 of the chip region 10.

Figure 13C:
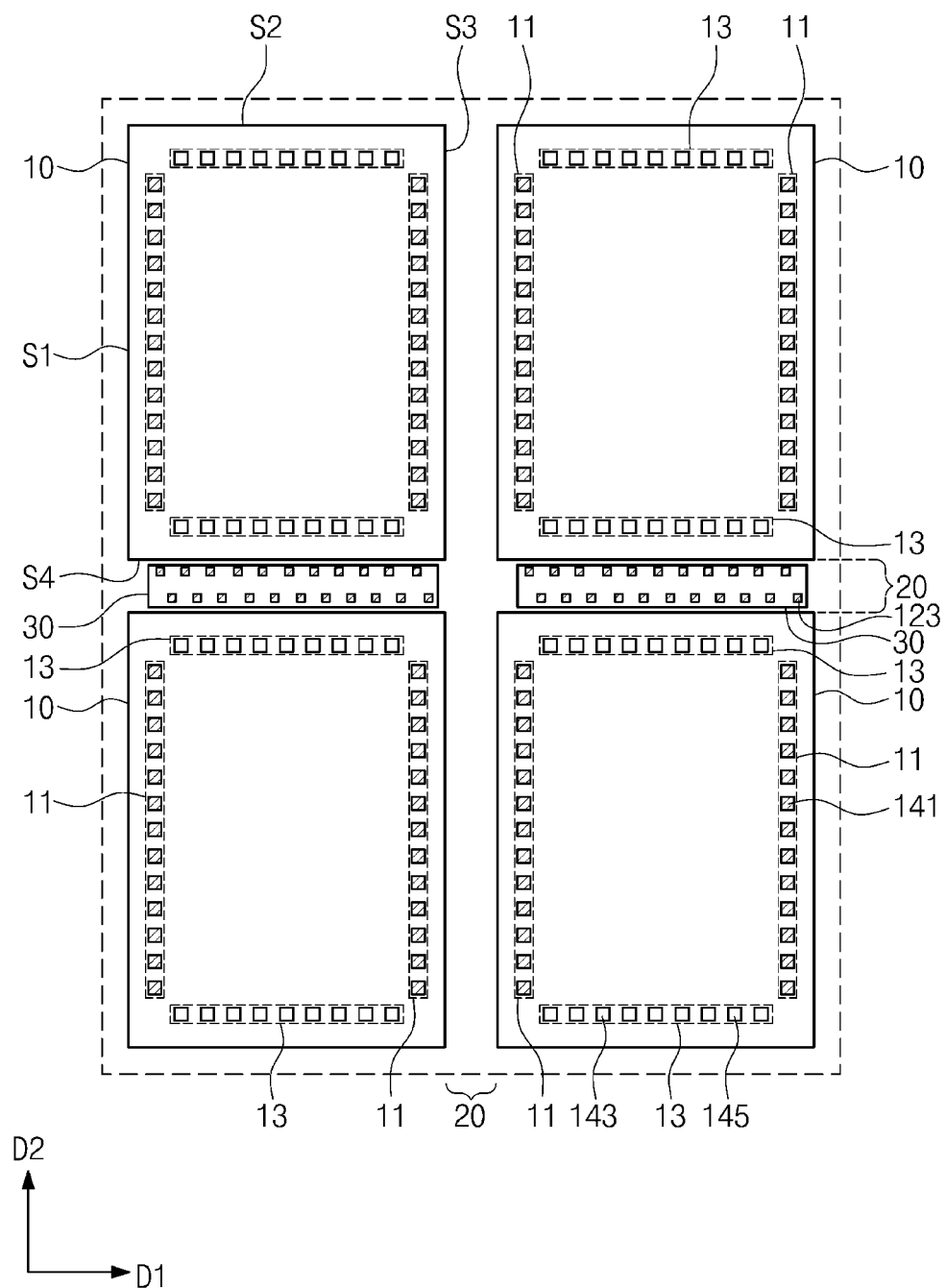

According to the example illustrated in FIG. 13C, the test element groups 30 are disposed on the scribe line region 20 between the chip regions 10 adjacent to each other in the first direction D2. The first pad regions 11 are disposed adjacent to the first and third sides S1 and S3 of the chip region 10, respectively, and the second pad regions 13 are disposed adjacent to the second and fourth sides S2 and S4, respectively. The redistribution chip pads 141 are spaced apart from each other and be arranged in the direction D2 on each of the first pad regions 11. The redistribution pads 143 and the redistribution dummy pads 145 are spaced apart from each other and be arranged in the second direction D1 on each of the second pad regions 13. As described above, the redistribution pads 143 and 145 are connected to the test pads 123 of the test element group 30.

Figure 13D:
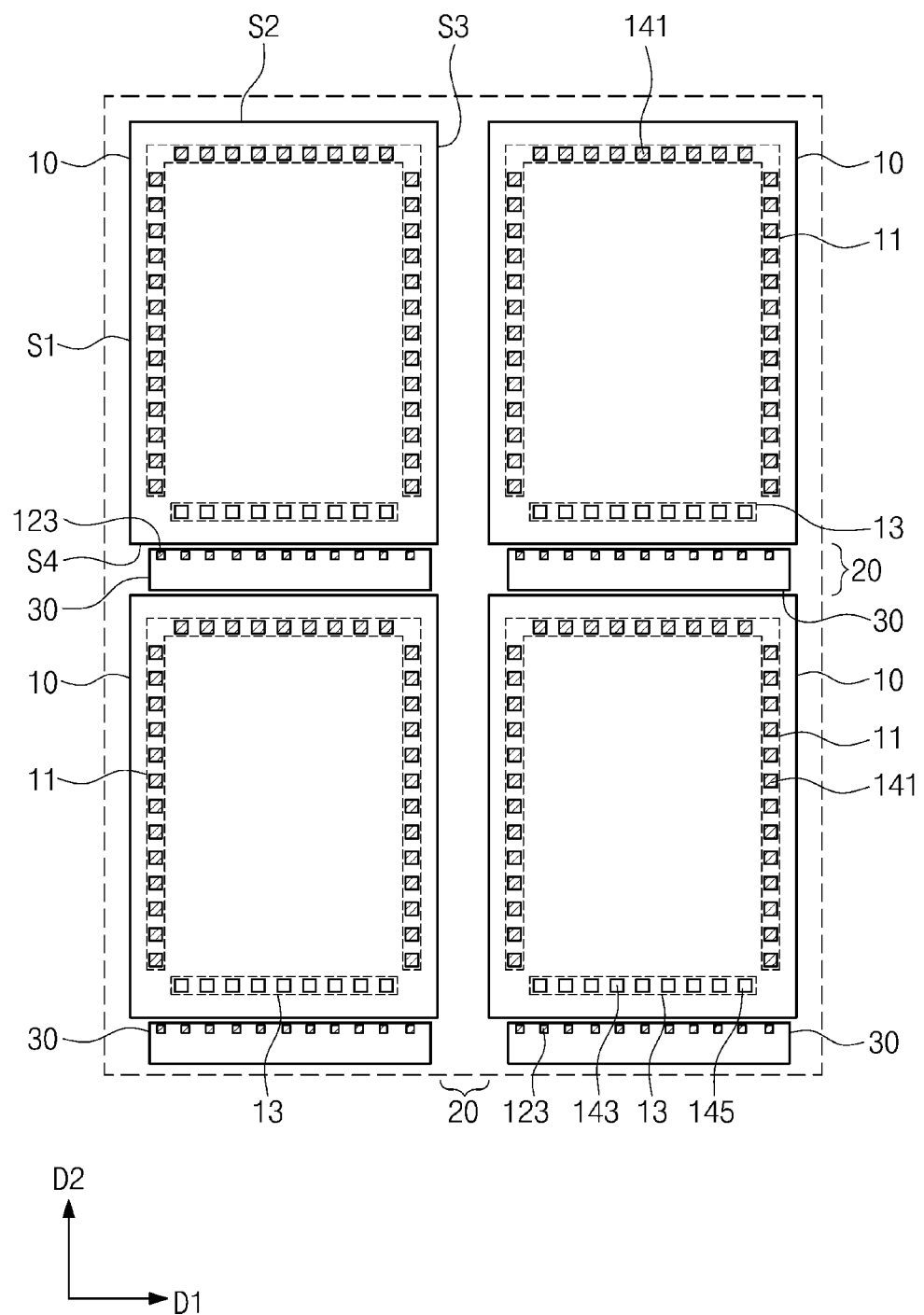
Figure 13E:
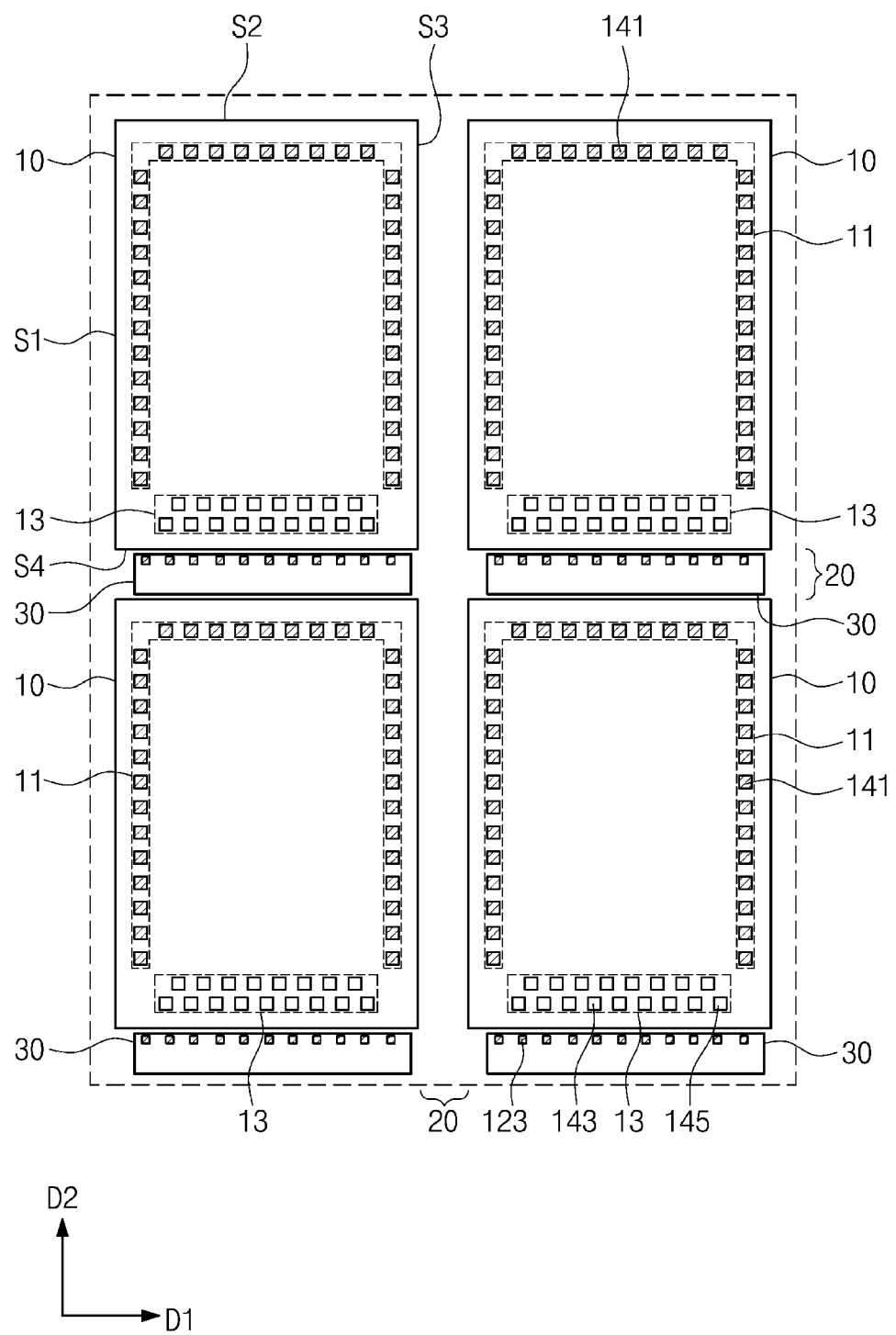

According to the examples illustrated in FIGS. 13D and 13E, the test element groups 30 are disposed on the scribe line region 20 between the chip regions 10 adjacent to each other in the first direction D2. The first pad region 11 is disposed along the first to third sides S1, S2 and S3 of the chip region 10, and the second pad region 13 is adjacent to the fourth side S4 of the chip region 10. The test pads 123 of the test element groups 30 are disposed adjacent to the fourth sides S4 of the chip regions 10 and connected to the redistribution pads 143 and 145 of the second pad regions 13 of the chip regions 10.

In the example illustrated in FIG. 13D, the redistribution pads 143 and the redistribution dummy pads 145 are arranged in a line in the second direction D1 on the second pad region 13. In the example illustrated in FIG. 13E, the redistribution pads 143 and the redistribution dummy pads 145 are arranged in two lines in the direction D1 on the second pad region 13, as described above with reference to FIG. 9.

Figure 13F:
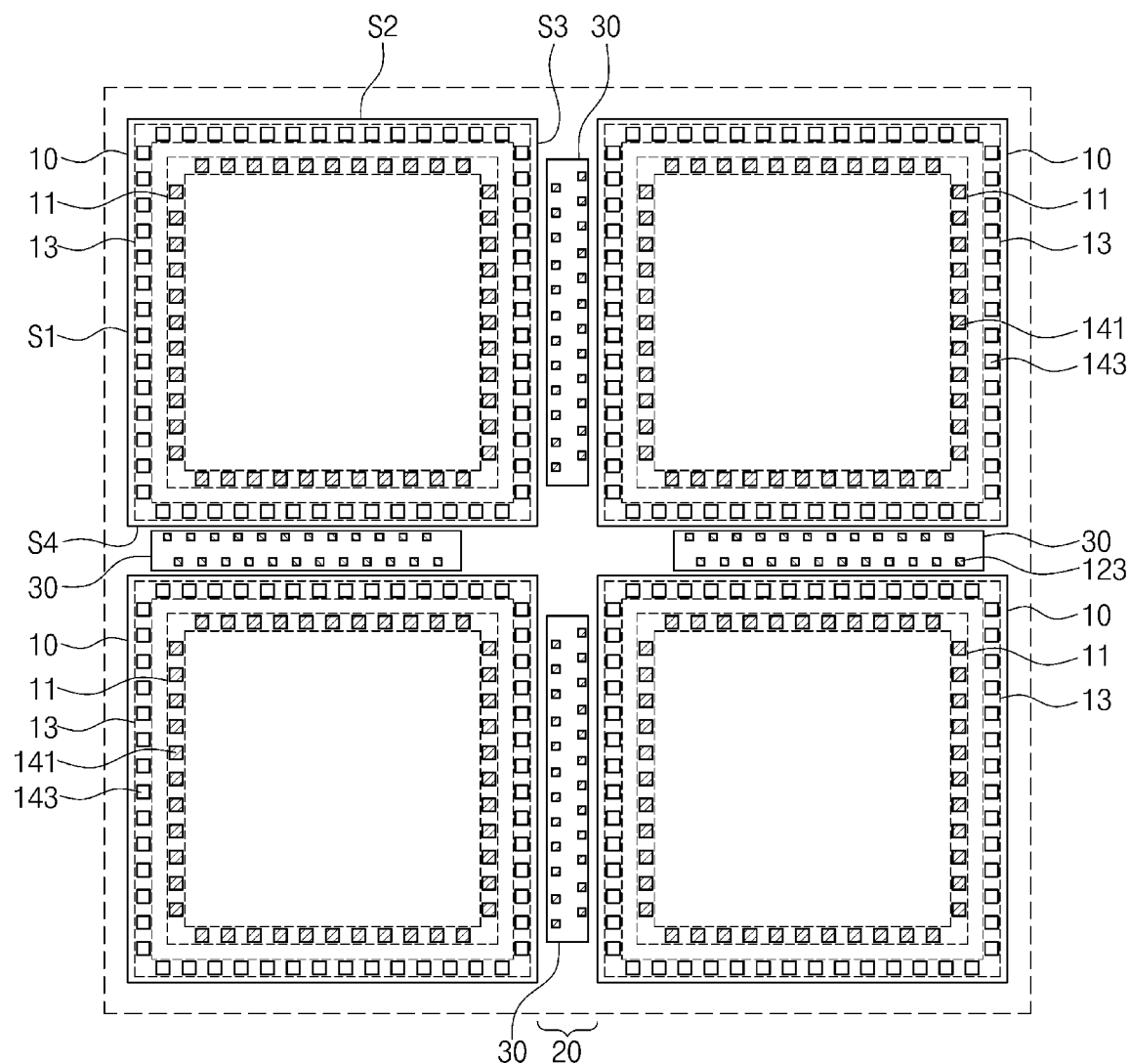

According to the example illustrated in FIG. 13F, the test element groups 30 are provided between the chip regions 10 adjacent to each other in the second direction D1 and between the chip regions 10 adjacent to each other in the direction D2. Each of the first and second pad regions 11 and 13 is disposed along the first to fourth sides S1, S2, S3 and S4 of the chip region 10. The second pad region 13 may be closer to the scribe line region 20 than the first pad region 11. In other words, the second pad region 13 may be disposed between the first pad region 11 and the scribe line region 20.

According to an aspect of the inventive concepts, the redistribution pads connected to the test structures may be disposed on the chip region adjacent to the edge region, and thus the areas of the redistribution pads on the scribe line region may be minimized. As a result, the scribe line region may be completely cut when the semiconductor substrate is cut along the scribe line region, and/or a crack may be prevented from forming at the chip regions.

According to another aspect of the inventive concepts, the connection structures and the redistribution pads, which are connected to the test structures on the edge region, may be formed as an integrated structure. Thus, the integrity of measurement values may be secured in the test process performed on the test structures.

According to still another aspect of the inventive concepts, the redistribution pads may be disposed together with the redistribution dummy pads on the chip region, and thus the test structures may be freely disposed on the scribe line region. In other words, regardless of the positions of the test structures on the scribe line region, the test structures may be tested through the redistribution pads and the redistribution dummy pads provided on the chip region.

Although the inventive concepts have been described with reference to various examples thereof, it will be apparent to those skilled in the art that various changes and modifications may be made to the disclosed examples without departing from the spirits and scopes of the inventive concepts. Therefore, it should be understood that the above examples are not limiting, but illustrative.

What is claimed is:

1. A semiconductor device comprising:
a semiconductor substrate including a chip region and an edge region around the chip region;
a semiconductor integrated circuit in the chip region of the semiconductor substrate;
first metal patterns and first metal vias electrically connected to the semiconductor integrated circuit;
a lower insulation layer covering the edge region;
a plurality of connection structures in the lower insulating layer and disposed over the edge region, the connection structures spaced from each other by first intervals in a first direction;
an upper insulating layer covering the connection structures; and
a plurality of redistribution pads disposed on the upper insulating layer, each of the redistribution pads being electrically connected to the connection structures, respectively,
wherein the lower insulation layer covers the semiconductor integrated circuit, the first metal patterns, and the first metal vias,
the redistribution pads include pad portions, respectively,
the pad portions of the redistribution pads are located over the chip region, and
the pad portions of the redistribution pads are collectively spaced apart from the connection structures in a second direction intersecting the first direction when viewed in a plan view.

2. The semiconductor device of claim 1, wherein respective ones of the pad portions of the redistribution pads are disposed adjacent one another as spaced by second intervals in the first direction.

3. The semiconductor device of claim 2, wherein the first intervals are substantially uniform, the second intervals are substantially uniform and each of the second intervals is substantially equal to or less than each of the first intervals.

4. The semiconductor device of claim 1, wherein the lower insulating layer comprises a dielectric material having a dielectric constant lower than that of the upper insulating layer, and
each of the connection structures includes second metal patterns and second metal vias alternately stacked with the second metal patterns.

5. The semiconductor device of claim 1, wherein each of the pad portions of the redistribution pads has a width greater than a width of the connection structure to which it is electrically connected.

6. The semiconductor device of claim 1, wherein each of the redistribution pads further includes:
a via portion extending through the upper insulating layer on the edge region and into contact with one of the connection structures; and
a line-shaped portion extending lengthwise in the second direction on a top surface of the upper insulating layer and connecting the via portion to the pad portion.

7. The semiconductor device of claim 1, wherein the chip region includes a first pad region spaced from the edge region, and a second pad region adjacent to the edge region so as to be located between the first pad region and edge region, and
the redistribution pads are located over the second pad region, and
further comprising:
redistribution chip pads disposed on the upper insulating layer and located over the first pad region.

8. The semiconductor device of claim 1,
further comprising:
a redistribution dummy pad disposed on the chip region and spaced apart from one of the redistribution pads by one of the first intervals, the redistribution dummy pad comprising a dummy via portion disposed in the upper insulating layer, a dummy pad portion disposed on a top surface of the upper insulating layer and located over the chip region, and a dummy line portion extending in the second direction on the top surface of the upper insulating layer and connecting the dummy via portion to the dummy pad portion, the dummy via portion is having a bottom surface contacting the upper insulating layer.

9. A semiconductor device comprising:
a semiconductor substrate having a chip region and an edge region around the chip region;
a lower insulating layer disposed on the semiconductor substrate;
a plurality of connection structures in the lower insulating layer, located over the edge region of the semiconductor substrate, and spaced from each other by first intervals in a first direction;
an upper insulating layer disposed on the lower insulating layer and covering the connection structures; and
redistribution pads disposed on the upper insulating layer and electrically connected to the connection structures, respectively,
wherein each of the redistribution pads includes:
a via portion extending vertically in the upper insulating layer, located over the edge region and by which the redistribution pad is electrically connected to one of the connection structures;

a pad portion disposed on the upper insulating layer and located over the chip region; and a line-shaped portion extending in a second direction intersecting the first direction on a top surface of the upper insulating layer and electrically connecting the via portion to the pad portion, wherein the via portion has a width less than a width of said one of the connection structures, the pad portion has a width greater than the width of the via portion, and the line-shaped portion has a width less than the width of the pad portion.

10. The semiconductor device of claim 9, wherein the width of the line-shaped portion is equal to or greater than the width of the via portion.

11. The semiconductor device of claim 9, wherein the lower insulating layer includes a dielectric material whose dielectric constant is lower than that of the upper insulating layer.

12. The semiconductor device of claim 9, wherein each of the connection structures includes first metal patterns and first metal vias alternately stacked with the first metal patterns, and the redistribution pads are of metal material different from that of the connection structures.

13. The semiconductor device of claim 9, wherein respective ones of the pad portions of the redistribution pads are disposed adjacent one another as spaced from each other by second intervals in the first direction, the first intervals are substantially uniform, the second intervals are substantially uniform, and each of the second intervals is substantially equal to or less than each of the first intervals.

14. The semiconductor device of claim 9, wherein each one of the pad portions of the redistribution pads is spaced apart in the second direction from the connection structure to which it is electrically connected by the same distance as each other of the pad portions is spaced apart in the second direction from the connection structure to which it is electrically connected, when viewed in a plan view.

15. A semiconductor device article of manufacture for singulating into a plurality of chip, comprising:

a semiconductor substrate having an array of chip regions and a scribe lane region in between the chip regions, the scribe lane region including a cutting region and an edge region directly adjacent to the chip regions so as to be located between the cutting region and the chip regions;

integrated circuits in the chip regions of the semiconductor substrate, respectively, test circuits, configured to test the integrated circuits, in the scribe lane region of the semiconductor substrate;

lower device insulation extending over the chip regions and edge region of the semiconductor substrate;

upper device insulation extending over the lower device insulation;

connection structures extending through the lower device insulation and electrically connected to the test circuits; and a plurality of redistribution pads electrically connected to the connection structures so as to be electrically connected to the test circuits via the connection structures, wherein the plurality of redistribution pads includes a respective array of conductive pads located over each of a plurality of the chip regions of the semiconductor substrate as disposed on the upper device insulation, whereby the test circuits can be accessed using the conductive pads, and each of the redistribution pads extends from a respective one of the chip regions to at least the edge region of the scribe lane region as viewed in a plan view.

16. The semiconductor device article of manufacture of claim 15, wherein the conductive pads of each respective array are spaced relative to each other each in a first direction, each of the redistribution pads includes a respective one of the conductive pads, a conductive line-shaped portion extending lengthwise in a second direction, intersecting the first direction, from the respective one of the conductive pads and a conductive via extending vertically in the upper device insulation from the conductive line-shaped portion.

17. The semiconductor device article of manufacture of claim 16, further comprising redistribution dummy pads spaced apart from the redistribution pads and electrically isolated from the integrated circuits and the test circuits, wherein each of the redistribution dummy pad comprises a dummy conductive pad disposed on a top surface of the upper device insulation and located over one of the chip regions, a dummy conductive line-shaped portion extending lengthwise from the dummy conductive pad, and a dummy conductive via extending vertically in the upper device insulation from the dummy conductive line-shaped portion.

18. The semiconductor device article of manufacture of claim 15, wherein the lower device insulation comprises a layer of low-k dielectric material, and further comprising:

internal redistribution interconnection structures disposed in the lower device insulation and electrically connected to the integrated circuits, respectively; and arrays of redistribution chip pads exposed at an upper surface of the upper device insulation, each of the arrays of redistribution chip pads being located over a respective one of the chip regions of the semiconductor substrate as spaced from the redistribution pads having the array of conductive pads located over said respective one of the chip regions, and each of the arrays of redistribution chip pads being electrically connected to a respective one of the internal redistribution interconnection structures so as to be electrically connected to the integrated circuit to which the respective one of the internal redistribution interconnection structures is electrically connected.

* * * * *